US012575245B2

(12) United States Patent
Baek et al.

(10) Patent No.: US 12,575,245 B2
(45) Date of Patent: Mar. 10, 2026

(54) DISPLAY DEVICE AND MANUFACTURING METHOD THEREOF

(71) Applicant: Samsung Display Co., LTD., Yongin-si (KR)

(72) Inventors: Sung Eun Baek, Yongin-si (KR); Sung Kook Park, Yongin-si (KR); Ki Seong Seo, Yongin-si (KR); Hyung Il Jeon, Yongin-si (KR); Jin Woo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 708 days.

(21) Appl. No.: 17/829,940

(22) Filed: Jun. 1, 2022

(65) Prior Publication Data

US 2023/0069326 A1 Mar. 2, 2023

(30) Foreign Application Priority Data

Aug. 30, 2021 (KR) ........................ 10-2021-0115117

(51) Int. Cl.
| | |
|---|---|
| *H10H 29/14* | (2025.01) |
| *G09G 3/00* | (2006.01) |
| *H10H 20/01* | (2025.01) |
| *H10K 59/123* | (2023.01) |

(52) U.S. Cl.
CPC ........... *H10H 29/142* (2025.01); *G09G 3/006* (2013.01); *H10H 20/01* (2025.01); *H10K 59/123* (2023.02)

(58) Field of Classification Search
CPC .... H10K 59/12; H10K 59/121; H10K 59/122; H10K 59/1213; H10K 59/123–125; H10K 59/131; H10D 86/441; H10D 86/021; H10D 86/60; H10H 29/14–142; H10H 29/30–34; H10H 29/37; H10H 29/39; H10H 29/49; H10H 29/832; G09G 2330/12; G09G 3/006
See application file for complete search history.

(56) References Cited

U.S. PATENT DOCUMENTS

| | | | |
|---|---|---|---|
| 11,393,964 B2 | 7/2022 | Kim et al. | |
| 2006/0152449 A1 | 7/2006 | Norimatu | |

(Continued)

FOREIGN PATENT DOCUMENTS

| | | |
|---|---|---|
| KR | 1020050088179 A | 9/2005 |
| KR | 10-2017-0104086 | 9/2017 |

(Continued)

*Primary Examiner* — Wael M Fahmy
*Assistant Examiner* — Quinton A Brasfield
(74) *Attorney, Agent, or Firm* — CANTOR COLBURN LLP

(57) ABSTRACT

A display device includes pixels that are arranged in a display area in a first direction and a second direction and that include first electrodes separated from each other and light emitting elements electrically connected to the first electrodes; second electrodes that are arranged separately from each other in the first direction and are electrically connected to the light emitting elements of the pixels arranged in the second direction; a first pad part including a first pad electrically connected to the first electrodes; and a second pad part including second pads electrically connected to different second electrodes among the second electrodes.

21 Claims, 16 Drawing Sheets

(56)                    References Cited

U.S. PATENT DOCUMENTS

| | | | | |
|---|---|---|---|---|
| 2015/0269884 | A1* | 9/2015 | Sato | G09G 3/3225 |
| | | | | 345/76 |
| 2021/0167177 | A1* | 6/2021 | Um | H10D 30/67 |
| 2022/0157914 | A1* | 5/2022 | Kim | G09G 3/006 |
| 2022/0208949 | A1* | 6/2022 | Kang | H01L 23/544 |
| 2022/0293712 | A1 | 9/2022 | Park et al. | |
| 2022/0352249 | A1 | 11/2022 | Park et al. | |
| 2022/0352251 | A1* | 11/2022 | Lee | H10H 20/812 |
| 2022/0352420 | A1* | 11/2022 | Park | H10H 20/8312 |

FOREIGN PATENT DOCUMENTS

| | | | |
|---|---|---|---|
| KR | 1020170102142 | A | 9/2017 |
| KR | 10-2191734 | | 12/2020 |
| KR | 1020210022801 | A | 3/2021 |
| KR | 1020210044938 | A | 4/2021 |
| KR | 10-2022-0149889 | | 11/2022 |

* cited by examiner

LCP

DPL

PCL

SUB

DR3

DR1

CF: CF1, CF2, CF3
EMA: EMA1, EMA2, EMA3
PXA: PXA1, PXA2, PXA3
WCP: WCP1, WCP2

M: M1', M2', M3', M4, M5, M6, M7
SC: SC1, SC2, SC3, SC4
SL: SL1, SL2, SL3, SL4

PX: PX1, PX2, PX3

PX: PX1, PX2, PX3

P2 { P2-1'
     P2-2'

PX: PX1, PX2, PX3

PX: PX1, PX2, PX3

10:15
Monday
Apr. 21

110: 110a, 110b

DISPLAY DEVICE AND MANUFACTURING METHOD THEREOF

CROSS-REFERENCE TO RELATED APPLICATION

This application claims priority to and the benefit of Korean Patent Application No. 10-2021-0115117 under 35 U.S.C. § 119 filed in the Korean Intellectual Property Office (KIPO) on Aug. 30, 2021, the entire contents of which are incorporated herein by reference.

BACKGROUND

1. Technical Field

Embodiments of the disclosure relate to a display device and a manufacturing method thereof.

2. Description of the Related Art

Recently, interest in an information display is increasing. Accordingly, research and development on a display device are continuously being conducted.

SUMMARY

The disclosure has been made in an effort to provide a display device and a manufacturing method thereof that may detect a defect caused by a light emitting element.

The objects of the disclosure are not limited to the object mentioned above, and other technical objects that are not mentioned may be clearly understood to a person of an ordinary skill in the art using the following description.

An embodiment of the disclosure provides a display device including pixels that are arranged in a display area in a first direction and a second direction and that include first electrodes separated from each other and light emitting elements electrically connected to the first electrodes; second electrodes that are arranged separately from each other in the first direction and are electrically connected to the light emitting elements of the pixels arranged in the second direction; a first pad part including a first pad electrically connected to the first electrodes; and a second pad part including second pads electrically connected to different second electrodes among the second electrodes.

The first pad part and the second pad part may face each other with the display area disposed between the first pad part and the second pad part.

The pixels further may include pixel circuits electrically connected to the first electrodes.

The first pad may be an initialization power pad to which a voltage of an initialization power source is applied. The first pad part may further include signal pads electrically connected to the pixel circuits of the pixels and to which driving signals of each of the pixel circuits are applied; and a first power pad electrically connected to the pixel circuits of the pixels and to which a voltage of a first power source is applied.

The pixel circuits may include driving transistors electrically connected between the first power pad and the first electrodes; and initialization transistors electrically connected between the first pad and the first electrodes.

The light emitting elements of the pixels sequentially arranged in the second direction may be commonly and electrically connected to one of the second electrodes. The initialization transistors of the pixels sequentially arranged in the second direction may be electrically connected to different gate lines to be sequentially turned on.

The respective light emitting elements may be disposed directly on the respective first electrodes. Each of the second electrodes may be disposed directly on the light emitting elements of the pixels sequentially arranged in the second direction.

Each of the light emitting elements may include a first end portion electrically contacting a corresponding one of the first electrodes and including a first semiconductor layer; a second end portion electrically contacting a corresponding one of the second electrodes and including a second semiconductor layer; and a light emitting layer disposed between the first semiconductor layer and the second semiconductor layer.

The second pads may be electrically connected to the second electrodes at a ratio of 1:1.

The number of the second pads may be less than a number of the second electrodes. The second pads may be electrically connected to the second electrodes at a ratio of 1:K, where K is a natural number greater than or equal to 2.

The pixels may include a first pixel and a second pixel that are continuously arranged in the first direction. A second electrode electrically connected to a light emitting element of the first pixel and a second electrode electrically connected to a light emitting element of the second pixel among the second electrodes may be electrically connected to different second pads among the second pads.

The display device may further include a third electrode that is disposed entirely on the second electrodes and is electrically connected to the second electrodes.

The display device may further include a power line disposed around the display area and electrically connected to the third electrode; and a second power pad provided in the first pad part and electrically connected to the power line.

The third electrode may be disposed entirely in the display area, and the third electrode may extend to a non-display area around the display area to overlap the power line in a plan view.

An embodiment of the disclosure provides a display device including pixels that are arranged in a display area in a first direction and a second direction and that include first electrodes separated from each other and light emitting elements electrically connected to the first electrodes; second electrodes that are arranged in the first direction and are electrically connected to the light emitting elements of the pixels arranged in the second direction; a third electrode entirely disposed on the second electrodes and electrically connected to the second electrodes; and a first pad part that includes a first pad and a first power pad electrically connected to the first electrodes via different circuit elements, and a second power pad electrically connected to the third electrode.

The display device may further include a second pad part including second pads electrically connected to different second electrodes among the second electrodes.

The pixels may further include pixel circuits electrically connected to the first electrodes. The pixel circuits may include driving transistors electrically connected between the first power pad and the first electrodes; and initialization transistors electrically connected between the first pad and the first electrodes.

An embodiment of the disclosure provides a manufacturing method of display device including applying a voltage of a first power source to first electrodes of the display device through a first pad of the display device; applying a voltage of a second power source to second electrodes of the display device through second pads of the display device; and detecting a current flowing in each of the second pads. While sequentially applying the voltage of the first power source to the first electrodes arranged in a second direction, a current flowing in each of the second electrodes may be individually detected through the second pads, so that defects caused by light emitting elements of the display device may be detected. The first electrodes may be arranged in a first direction and the second direction, the second electrodes may be arranged in the first direction and disposed on the light emitting elements arranged in the second direction, the first pad may be electrically connected to the first electrode, and the second pads may be electrically connected to the second electrodes.

The manufacturing method of the display device may further include, in case that a defect caused by at least one of the light emitting elements is detected, repairing the defect.

The manufacturing method of the display device may further include forming a third electrode entirely on the second electrodes.

Particularities of other embodiments are included in the detailed description and drawings.

In the display device and the manufacturing method thereof according to the embodiments of the disclosure, it is possible to readily detect a defect caused by light emitting elements provided in respective pixels. Accordingly, it is possible to improve manufacturing efficiency of the display device.

Effects of embodiments of the disclosure are not limited by what is illustrated in the above, and more various effects are included in the present specification.

BRIEF DESCRIPTION OF THE DRAWINGS

The above and other aspects, features, and advantages of certain embodiments of the disclosure will be more apparent from the following description taken in conjunction with the accompanying drawings.

FIG. 5 illustrates a schematic cross-sectional view of a display device according to an embodiment of the disclosure.

DETAILED DESCRIPTION OF THE EMBODIMENTS

Figure 1:
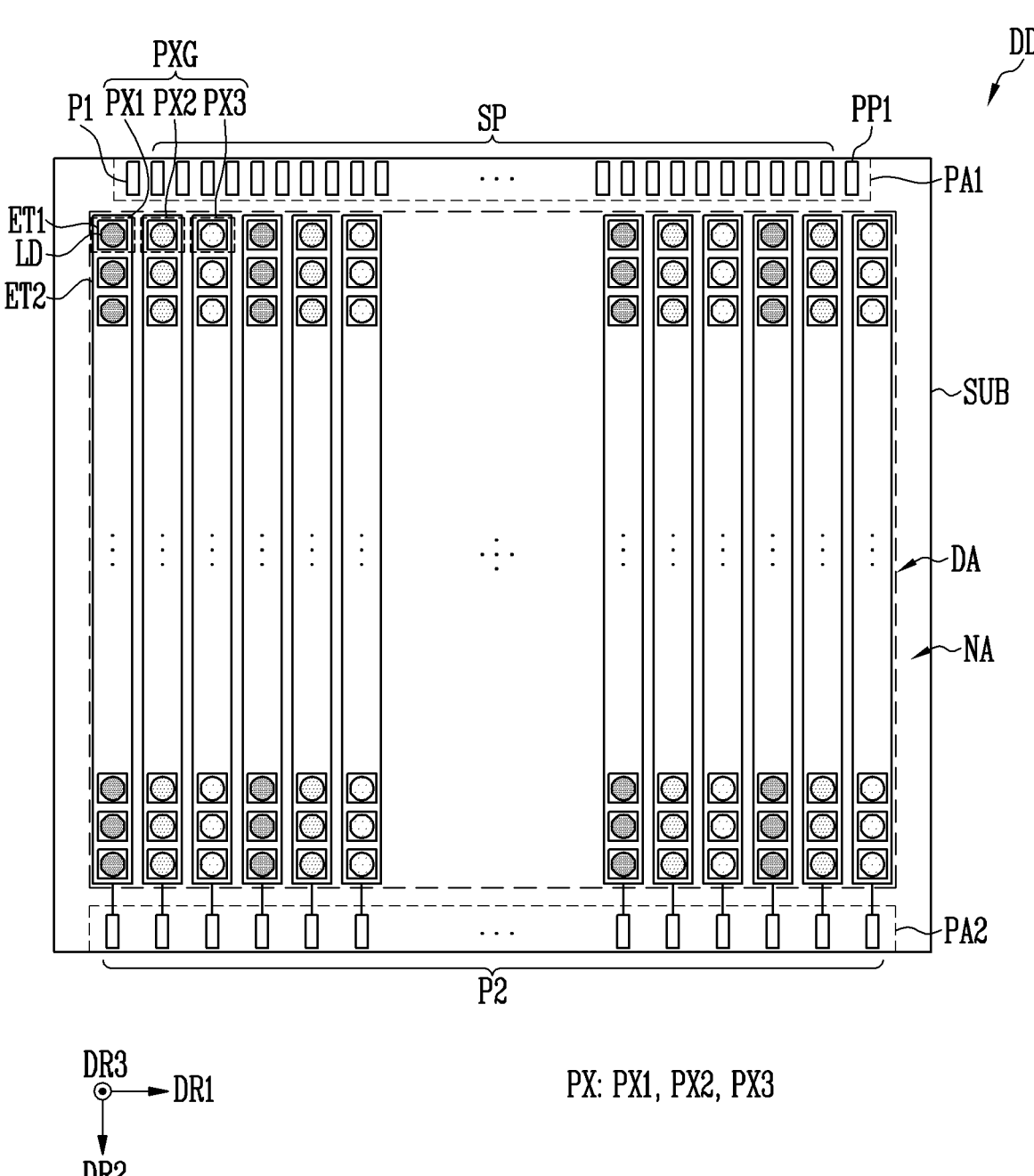
FIG. 1 and FIG. 2 each illustrate a schematic plan view of a display device according to an embodiment of the disclosure.

Since the disclosure may be variously modified and have various forms, embodiments will be illustrated and described in detail in the following. In the description below, singular forms are to include plural forms unless the context clearly indicates only the singular.

However, the disclosure is not limited to the embodiments disclosed hereinafter and may be implemented in various forms. In addition, each embodiment disclosed below may be implemented alone, or may be implemented in combination with at least another embodiment.

Some of the elements not directly related to the features of the disclosure in the drawing may be omitted in order to clearly illustrate the disclosure. For the same or similar elements throughout drawing, the same reference numerals and symbols are to be given as much as possible even if they are displayed on different drawings, and duplicate descriptions will be omitted.

In describing the embodiments of the disclosure, the term "connection (or coupling)" may comprehensively mean a physical and/or electrical connection (or coupling). In addition, it may comprehensively mean a direct connection (or coupling) and an indirect connection (or coupling), and may comprehensively mean an integral connection (or coupling) and a non-integral connection (or coupling).

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
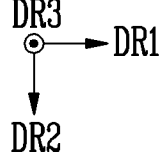

FIGS. 1 and 2 each illustrate a schematic plan view of a display device DD according to an embodiment. FIGS. 1 and 2 illustrate different embodiments with respect to shapes of pixels PX and the display device DD, and an arrangement structure of the pixels PX.

FIGS. 1 and 2 schematically illustrate a structure of the display device DD based on a display panel including a display area DA. The display device DD may further include a driving circuit (for example, a driving circuit including a scan driver, a data driver, a timing controller, and the like) for driving the pixels PX. In the embodiment, at least a part of the driving circuit may be formed and/or disposed inside the display panel, and in an embodiment, the driving circuit may be provided outside of the display panel to be electrically connected to the display panel.

Referring to FIGS. 1 and 2, the display device DD may include a substrate SUB and pixels PX disposed on the substrate SUB.

The substrate SUB is a base member for configuring the display device DD and may configure, for example, a base surface of the display device DD. The substrate SUB may include a display area DA in which the pixels PX are disposed, and a non-display area NA around the display area DA. The display area DA may display an image by means of the pixels PX, thereby configuring a screen. The non-display area NA may be an area excluding the display area DA and may surround at least a portion of the display area DA. Wires electrically connected to the pixels PX of the display area DA, a built-in circuit part, and/or first and second pad parts PA1 and PA2 may be disposed in the non-display area NA.

The display device DD may be provided in various shapes. As an example, the display device DD may be provided as a quadrangular panel as in the embodiment of FIG. 1, but the disclosure is not limited thereto. For example, the display device DD may be provided as a non-quadrangular panel such as a circular shape or an elliptical shape as in the embodiment of FIG. 2. In addition, the display device DD may have various shapes. The display device DD may be provided as a substantially flat panel, or as a three-dimensional panel having curves or irregularities (e.g., protrusions and recesses) in a thickness direction.

FIGS. 1 and 2 illustrate embodiments in which the display device DD is provided as flat panels having a rectangular shape and a circular shape, respectively. A horizontal direction (for example, a row direction or an X direction) of the display device DD is referred to as a first direction DR1, a vertical direction (for example, a column direction or a Y direction) of the display device DD is referred to as a second direction DR2, and a thickness direction (or a height direction) of the display device DD is referred to as a third direction DR3.

The display area DA may have various shapes. For example, the display area DA may have a rectangular shape as in the embodiment of FIG. 1, or a circular shape as in the embodiment of FIG. 2. In addition, the display area DA may have various shapes.

In an embodiment, the display area DA may have a shape corresponding to the shape of the display device DD (for example, a similar shape to or the same shape as it). For example, in case that the display device DD has a quadrangular shape, the display area DA may have a quadrangular shape matching the size and/or shape of the display device DD. As another example, in case that the display device DD has a circular shape or an elliptical shape, the display area DA may have a circular or elliptical shape matching the size and/or shape of the display device DD.

In an embodiment, the display area DA may have a shape different from that of the display device DD. For example, the display device DD may have a quadrangular shape, and the display area DA may have a non-quadrangular shape such as a circular shape or an elliptical shape. Conversely, the display device DD may have a non-quadrangular shape, and the display area DA may have a quadrangular shape.

The pixels PX may be arranged in the display area DA. For example, the display area DA may include pixel areas in which each pixel PX is provided and/or disposed, and each pixel PX may be disposed in each pixel area on the substrate SUB.

The pixels PX may be arranged in the display area DA in the first direction DR1 and the second direction DR2. The first direction DR1 and the second direction DR2 are different directions and may be directions intersecting each other. For example, the first direction DR1 and the second direction DR2 may be directions orthogonal to each other, but the disclosure is not limited thereto.

In an embodiment, the pixels PX may be arranged in the display area DA in a matrix in the first direction DR1 and the second direction DR2. The pixels PX may be arranged in the display area DA in other shapes and/or structures.

Each pixel PX may include a first electrode ET1 and at least one light emitting element LD electrically connected to the first electrode ET1. Each pixel PX may further include a second electrode ET2 electrically connected to each light emitting element LD.

In an embodiment, at least two pixels PX adjacent to each other in the second direction DR2 may share a second electrode ET2. In this case, each second electrodes ET2 may be regarded as an element included in each of the at least two pixels PX, or it may be an element separate from the at least two pixels PX and may be electrically connected to the at least two pixels PX.

The first electrodes ET1 may be formed separately from each other in respective pixel areas. For example, the first electrodes ET1 may be disposed in respective pixel areas in the first direction DR1 and the second direction DR2, and may be separated from each other.

The first electrodes ET1 may be individually supplied with a driving signal (for example, a driving current and/or a voltage of a first power source). For example, each of the first electrodes ET1 may be supplied with each driving signal through a pixel circuit (for example, a pixel circuit PXC of FIG. 3 or 4) of the corresponding pixel PX.

The light emitting elements LD may be disposed on respective first electrodes ET1 to be electrically connected to respective first electrodes ET1. For example, each light emitting element LD may be disposed on the first electrode ET1 of the corresponding pixel PX to be electrically connected to the first electrode ET1. The light emitting elements LD may be electrically connected to respective second electrodes ET2.

The light emitting elements LD may include respective first end portions electrically connected to respective first electrodes ET1 and respective second end portions electrically connected to respective second electrodes ET2. For example, each light emitting element LD may be disposed between the first electrode ET1 and the second electrode ET2 of the corresponding pixel PX, and may be electrically connected between the first electrode ET1 and the second electrode ET2.

Each light emitting element LD may have various types, structures, sizes, and/or shapes.

In an embodiment, the light emitting element LD may be a light emitting diode including a nitride-based semiconductor material, a phosphide-based semiconductor material, or other semiconductor material. For example, the light emitting element LD may be an inorganic light emitting diode including at least one semiconductor material of GaN, AlGaN, InGaN, InGaAlN, AlN, InN, and AlInN, or at least one semiconductor material of GaP, GaInP, AlGaP, AlGaInP, AlP, and InP.

In an embodiment, the light emitting element LD may have a size in a range of nanometers to micrometers. For example, the light emitting element LD may have a diameter, a width, a length, and/or a thickness ranging from several tens of nanometers to several tens of micrometers.

In an embodiment, the light emitting element LD may include a light emitting stack including a first semiconductor layer, an emission layer, and a second semiconductor layer sequentially disposed in a direction (for example, the third direction DR3). For example, the light emitting element LD may include a first semiconductor layer, an emission layer, and a second semiconductor layer sequentially stacked on each first electrode ET1.

Each of the second electrodes ET2 may be disposed on each of the light emitting elements LD. For example, the second electrode ET2 of the corresponding pixel column may be disposed on the light emitting elements LD of each pixel column.

The second electrodes ET2 may be divided from each other in the first direction DR1. For example, the second electrodes ET2 may be arranged to be separated from each other in the first direction DR1. Different second electrodes ET2 may be disposed on the light emitting elements LD of the pixels PX arranged in different pixel columns in the first direction DR1.

Each second electrode ET2 may extend in the second direction DR2 and may be electrically connected to light emitting elements LD of the pixels PX arranged in the second direction DR2. For example, a second electrode ET2 may be provided for each pixel column, and the light emitting elements LD of the pixels PX arranged in each pixel column in the second direction DR2 may be commonly and electrically connected to a second electrode ET2 provided in the corresponding pixel column.

In an embodiment, the pixels PX arranged in each pixel row in the first direction DR1 may be connected to the same gate lines to be simultaneously driven, and may output respective driving currents through different second electrodes ET2. Accordingly, while the pixels PX arranged in each pixel row are driven, the driving currents flowing through the light emitting elements LD provided in the pixels PX of the corresponding pixel row may be individually detected.

The pixels PX may have a structure according to at least one of embodiments to be described below. For example, the pixels PX may have a structure to which one of embodiments to be described below is applied alone, or a structure to which at least two embodiments are applied in combination.

In an embodiment, the display device DD may include pixels PX that emit light of different colors. For example, the display device DD may include pixels PX (hereinafter referred to as a "first pixels PX1") that emit light of a first color, pixels PX (hereinafter referred to as a "second pixels PX2") that emit light of a second color, and pixels PX (hereinafter referred to as a "third pixels PX3") that emit light of a third color. At least one first pixel PX1, at least one second pixel PX2, and at least one third pixel PX3 disposed to be adjacent to each other may configure a pixel group PXG. By individually controlling light emitting luminance of the first, second, and third pixels PX1, PX2, and PX3 configuring each pixel group PXG, the pixel group PXG may emit full-color light.

The first, second, and third pixels PX1, PX2, and PX3 may be arranged in the display area DA in various arrangement structures. In the embodiment, the first, second, and third pixels PX1, PX2, and PX3 may be arranged in the display area DA in a stripe form as shown in FIG. 1. For example, the first, second, and third pixels PX1, PX2, and PX3 may be sequentially and repeatedly arranged in each pixel row extending in the first direction DR1, and the first pixels PX1, the second pixels PX2, or the third pixels PX3 may be sequentially arranged in each pixel column extending in the second direction DR2.

In an embodiment, the first, second, and third pixels PX1, PX2, and PX3 may be arranged in the display area DA so that the first pixels PX1, the second pixels PX2, and the third pixels PX3 are continuously arranged in an oblique direction (for example, in a diagonal direction of the display device DD) inclined with respect to the first and second directions DR1 and DR2 as shown in FIG. 2. For example, the first, second, and third pixels PX1, PX2, and PX3 may be sequentially and repeatedly arranged in each pixel row extending in the first direction DR1, and the first pixels PX1, the second pixels PX2, and the third pixels PX3 may be sequentially arranged in an oblique direction inclined with respect to the first and second directions DR1 and DR2.

The arrangement structure of the pixels PX may be variously changed. For example, the pixels PX may be arranged in the display area DA according to a PENTILE™ arrangement method or an arrangement method of a different shape and/or structure.

In an embodiment, the first, second, and third pixels PX1, PX2, and PX3 may include the light emitting elements LD displaying a same color, and light conversion layers and/or color filters corresponding to a specific color may be disposed inside or on the first, second, and/or third pixels PX1, PX2, and/or PX3. Accordingly, the first, second, and third pixels PX1, PX2, and PX3 may emit light of a first color, a second color, and a third color, respectively.

In an embodiment, the first, second, and third pixels PX1, PX2, and PX3 may include the light emitting elements LD displaying a first color, a second color, and a third color, respectively. Accordingly, the first, second, and third pixels PX1, PX2, and PX3 may emit light of the first color, the second color, and the third color, respectively.

A first pad part PA1 may include pads including a first pad P1 (also referred to as a "third power pad" or an "initialization power pad"). For example, the first pad part PA1 may include a first pad P1, a first power pad PP1, and signal pads SP. The first pad P1, the first power pad PP1, and the signal pads SP may be electrically connected to the pixels PX inside the display panel, and accordingly, the voltage of driving power sources and driving signals that are applied to the first pad P1, the first power pad PP1, and the signal pads SP may be supplied to the pixels PX. The first pad part PA1 may be electrically connected to at least one circuit board or the like by a bonding process or the like, and the voltage of respective driving power sources and driving signals may be supplied to pads of the first pad part PA1 through the circuit board.

The first pad P1 may be electrically connected to the first electrodes ET1 of the pixels PX via wires and/or pixel circuits PXC of the pixels PX inside the display panel. In the embodiment, the first pad P1 may be an initialization power pad to which a voltage of the initialization power source is applied during an actual use period of the display device DD (for example, a driving period of the display device DD). For example, a voltage of an initialization power source for initializing respective voltages of the first electrodes ET1 may be applied to the first pad P1 during a period in which the display device DD is driven.

In an embodiment, after the first electrodes ET1, the light emitting elements LD, and the second electrodes ET2 are provided to the pixels PX, the display device DD may be manufactured by an inspection process to detect defects (for example, defects in respective light emitting elements LD themselves and/or connection defects in respective light emitting elements LD (for example, short circuit defects and/or bonding defects)) caused by the light emitting elements LD. For example, a process of manufacturing the display device DD may include a light emitting element inspection process for determining whether the pixel PX is defective due to the light emitting element LD provided in each pixel PX.

In an embodiment, a defect caused by other factors such as the pixel circuits PXC is excluded, and in order to more accurately detect a defect caused by the light emitting element LD of each pixel PX, the voltage of the first power source may be applied to the first electrodes ET1 of the pixels PX through the first pad P1 during the light emitting element inspection process. In this case, the voltage of the first power source may be applied to the first pad P1 during the light emitting element inspection process, and the voltage of the initialization power source may be applied to the first pad P1 in the display device DD that has been manufactured.

For example, the first pad P1 may be a power pad supplied with the voltage of the first power source during the light emitting element inspection process performed to detect the defect caused by the light emitting element LD during the manufacturing process of the display device DD. The first pad P1 may be a power pad supplied with the voltage of the initialization power source during the driving period of the display device DD in the display device DD that has been manufactured.

The first power pad PP1 may be electrically connected to the pixel circuits PXC of the pixels PX via the wires inside the display panel. The first power pad PP1 may be electrically connected to the first electrodes ET1 of the pixels PX through respective pixel circuits PXC. The first power pad PP1 may be electrically connected to the first electrodes ET1 of the pixels PX through a path different from that of the first pad P1. For example, the first pad P1 and the first power pad PP1 may be electrically connected to the first electrodes ET1 of the pixels PX via different circuit elements (for example, different transistors included in respective pixel circuits PXC).

The first power pad PP1 may be a power pad for transmitting the voltage of the first power source to the pixels PX during the driving period of the display device DD. For example, the voltage of the first power source may be applied to the first power pad PP1 during the driving period of the display device DD.

The signal pads SP may be electrically connected to the pixel circuits PXC of the pixels PX via the wires inside the display panel. The signal pads SP may be signal pads to which driving signals of respective pixel circuits PXC are applied. For example, the signal pads SP may include gate pads and data pads for transmitting respective gate signals (for example, respective scan signal, respective initialization control signals, and/or respective light emission control signals) and data signals to the pixel circuits PXC.

The second pad part PA2 may include second pads P2 electrically connected to respective second electrodes ET2. In an embodiment, the second pads P2 may be individually connected to some different second electrodes ET2 among the second electrodes ET2 provided in the display area DA. For example, the second pads P2 may be electrically connected to the second electrodes ET2 at a ratio of about 1:1. Accordingly, a voltage of a second power source may be individually supplied to respective second electrodes ET2 through respective the second pads P2. Currents flowing through respective second electrodes ET2 may be individually detected through respective second pads P2. Accordingly, it is possible to individually detect whether the light emitting elements LD included in the pixels PX are defective, and their positions.

In an embodiment, the first pad part PA1 and the second pad part PA2 may be disposed in different edge areas of the display device DD. For example, the first pad part PA1 and the second pad part PA2 may face each other with the display area DA interposed therebetween. For example, in case that the first pad part PA1 is disposed in an upper end edge area of the display device DD, the second pad part PA2 may be disposed in a lower end edge area of the display device DD.

In case that the first pad part PA1 and the second pad part PA2 are separately disposed in different edge areas of the display device DD, it is possible to readily secure a space for forming the second pads P2, and it is possible to readily and electrically connect respective second pads P2 to respective second electrodes ET2. In addition, it is possible to readily dispose a circuit board or an inspection device on the second pad part PA2 in the light emitting element inspection process and the like.

Figure 3:
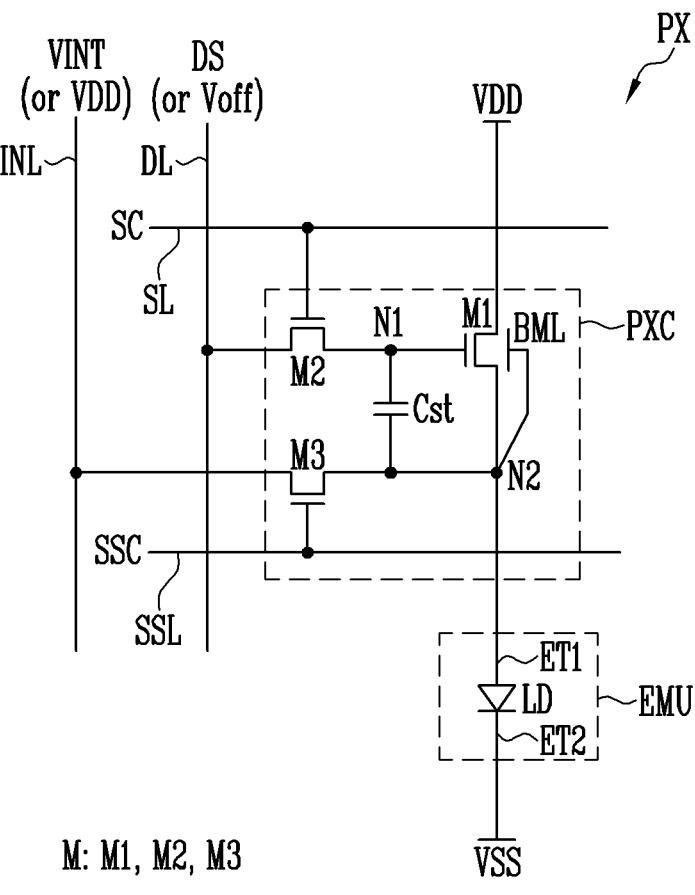
FIG. 3 and FIG. 4 each illustrate a schematic diagram of an equivalent circuit of a pixel according to an embodiment of the disclosure.
Figure 4:
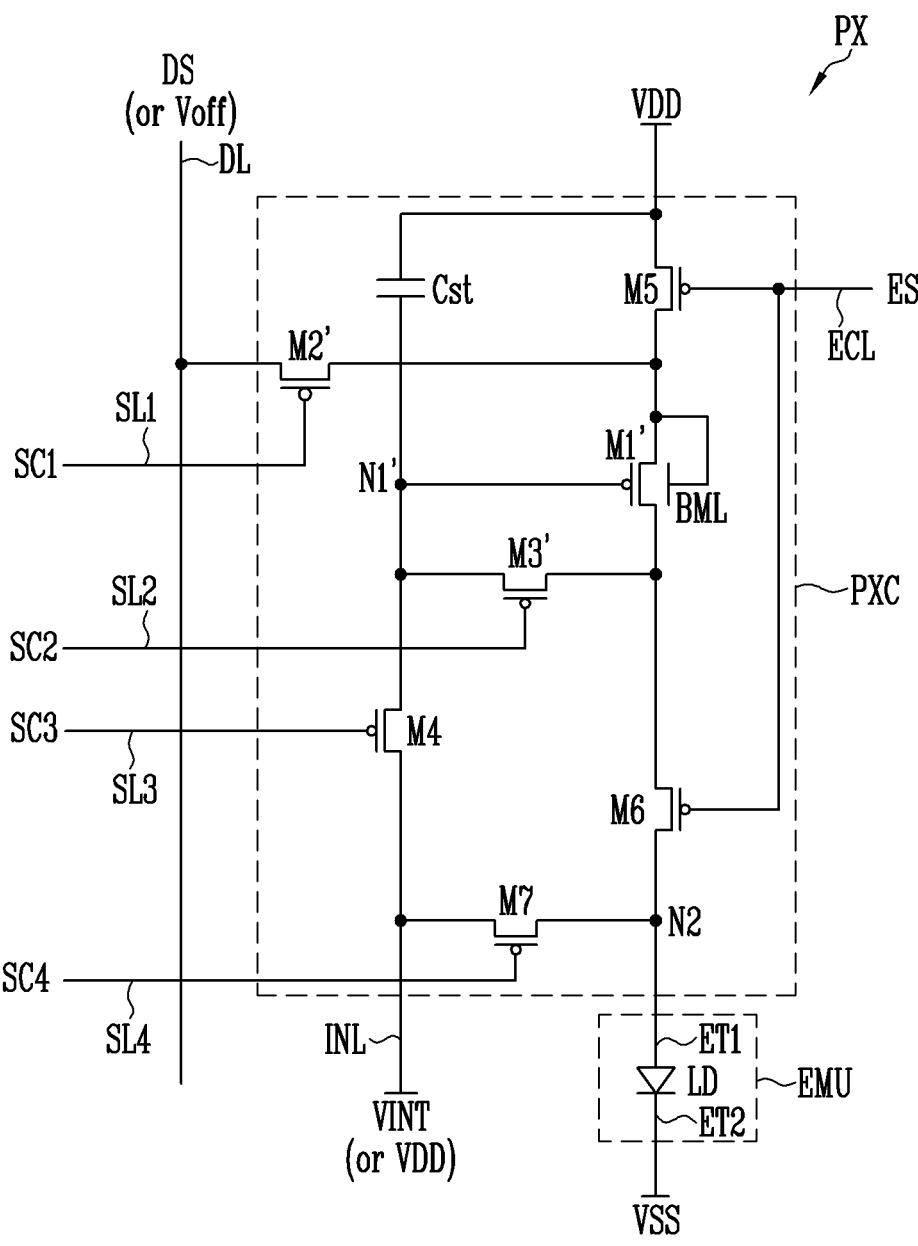

FIGS. 3 and 4 each illustrate a schematic diagram of an equivalent circuit of the pixel PX according to an embodiment. For example, FIGS. 3 and 4 illustrate the pixels PX including pixel circuits PXC having different structures.

In some embodiments, each pixel PX illustrated in FIGS. 3 and 4 may be one of the pixels PX disposed in the display area DA of FIGS. 1 and 2. For example, the pixel PX of FIG. 3 or 4 may be one of the first pixel PX1, the second pixel PX2, and the third pixel PX3. The pixels PX disposed in the display area DA may have substantially the same or similar structure. The pixels PX may have various structures in addition to the structures disclosed in the embodiments of FIGS. 3 and 4.

Referring to FIGS. 1 to 3, the pixel PX may be electrically connected to a scan line SL and a data line DL. The pixel PX may be electrically connected to a first power source VDD (or the first power pad PP1 which is electrically connected to the first power source VDD and to which a voltage of the first power source VDD is applied) and a second power source VSS (or each of the second pads P2 which is electrically connected to the second power source VSS and to which a voltage of the second power source VSS is applied). In an embodiment, the pixel PX may be further electrically connected to at least one other signal line and/or a power line. For example, the pixel PX may be electrically connected to a control line SSL and an initialization power line INL (for example, a wire electrically connected to the first pad P1 to which a voltage of an initialization power source VINT is applied).

The pixel PX may include a light emitting part EMU for generating light of a luminance corresponding to each data signal DS. The pixel PX may further include a pixel circuit PXC for driving the light emitting part EMU.

The light emitting part EMU may include a first electrode ET1, a second electrode ET2, and at least one light emitting element LD electrically connected between the first and second electrodes ET1 and ET2. The light emitting element LD may be electrically connected to the first power source VDD through the first electrode ET1 and/or the pixel circuit PXC, and may be electrically connected to the second power source VSS through the second electrode ET2.

The first power source VDD and the second power source VSS may supply voltages of different potentials. A potential difference between the first power source VDD and the second power source VSS may be greater than or equal to a threshold voltage of the light emitting element LD.

In an embodiment, the light emitting part EMU may include a single light emitting element LD electrically connected in a forward direction between the pixel circuit PXC and the second power source VSS as in the embodiments of FIGS. 3 and 4. In another embodiment, the light emitting part EMU may include light emitting elements LD that are connected in a forward direction between the first power source VDD and the second power source VSS. For example, the light emitting part EMU may include light emitting elements LD that are connected in parallel, in series, or in parallel-series between the pixel circuit PXC and the second power source VSS. In an embodiment, each light emitting element LD may be an inorganic light emitting diode manufactured with a small size ranging from nanometers to micrometers by using a nitride-based semiconductor material or a phosphide-based semiconductor material, but the disclosure is not limited thereto. The type, connection structure, and/or number of the light emitting element(s) LD configuring the light emitting part EMU may be variously changed according to embodiments.

At least one light emitting element LD electrically connected in a forward direction between the first power source VDD and the second power source VSS may configure an effective light source of each pixel PX. In case that a driving current is supplied to each light emitting element LD through the pixel circuit PXC of the corresponding pixel PX, the light emitting element LD may emit light with a luminance corresponding to the driving current. Accordingly, the pixel PX may emit light with a luminance corresponding to the driving current.

The pixel circuit PXC may be electrically connected between the first power source VDD and the light emitting part EMU. For example, the pixel circuit PXC may be electrically connected between the first power pad PP1 electrically connected to the first power source VDD and the first electrode ET1 provided in the light emitting part EMU of the corresponding pixel PX.

The pixel circuit PXC may be electrically connected to the scan line SL and the data line DL and may be supplied with a scan signal SC and a data signal DS from the scan line SL and the data line DL, respectively. The pixel circuit PXC may be electrically connected to the control line SSL and the initialization power line INL and may be supplied with a control signal SSC and the voltage of the initialization power source VINT from the control line SSL and the initialization power line INL, respectively.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be electrically connected between the first power source VDD and a second node N2. The second node N2 may be a node at which the pixel circuit PXC and the light emitting part EMU are electrically connected to each other. For example, the second node N2 may be a node at which an electrode (for example, a source electrode) of the first transistor M1 and the first electrode ET1 of the light emitting part EMU (for example, an anode of the light emitting part EMU) are electrically connected to each other. A gate electrode of the first transistor M1 may be electrically connected to a first node N1.

The first transistor M1 may be a driving transistor of each pixel PX. For example, the first transistor M1 may be electrically connected between the first power pad PP1, to which the voltage of the first power source VDD is applied, and the first electrode ET1 of each pixel PX to control a driving current supplied to the light emitting part EMU in response to a voltage of the first node N1.

In an embodiment, the first transistor M1 may further include a bottom metal layer BML (also referred to as "second gate electrode" or "back gate electrode"). In an embodiment, the bottom metal layer BML may be electrically connected to an electrode (for example, a source electrode) of the first transistor M1.

In an embodiment in which the first transistor M1 includes the bottom metal layer BML, by applying a back-biasing voltage to the bottom metal layer BML of the first transistor M1, a back-biasing technique (or a sync technique) of moving a threshold voltage of the first transistor M1 in a negative or positive direction may be applied. In case that the bottom metal layer BML is disposed to overlap a semiconductor pattern configuring a channel of the first transistor M1, light incident on the semiconductor pattern is blocked, thereby stabilizing an operational characteristic of the first transistor M1.

The second transistor M2 may be electrically connected between the data line DL and the first node N1. A gate electrode of the second transistor M2 may be electrically connected to the scan line SL of the corresponding horizontal line. In case that a scan signal SC of a gate-on voltage (for example, a logic high voltage or a high-level voltage) is supplied from the scan line SL, the second transistor M2 may be turned on to electrically connect the data line DL and the first node N1.

The second transistor M2 may be a switching transistor for transmitting each data signal DS to the inside of the pixel PX. For example, for each frame period, a data signal DS of the corresponding frame is supplied to the data line DL, and the data signal DS may be transmitted to the first node N1 through the second transistor M2 during a period in which the scan signal SC of the gate-on voltage is supplied. For example, for each horizontal period configuring each frame period, the scan signal SC of a gate-on voltage may be simultaneously supplied to the pixels PX of a horizontal line corresponding to the corresponding horizontal period. Accordingly, the second transistors M2 provided in the pixels PX of the corresponding horizontal line are turned on, so that respective data signals DS supplied to the data lines DL formed for each pixel column may be simultaneously supplied to the pixels PX of the corresponding horizontal line.

The second transistors M2 of the pixels PX sequentially arranged in the first direction DR1 may share the scan line SL disposed on the corresponding horizontal line, and may be simultaneously turned on by the scan signal SC of the gate-on voltage supplied through the scan line SL. The second transistors M2 of the pixels PX sequentially arranged in different pixel rows in the second direction DR2 may be electrically connected to different gate lines (for example, respective scan lines SL corresponding to respective pixel rows) to be sequentially turned on.

A first electrode of the capacitor Cst may be electrically connected to the first node N1. A second electrode of the capacitor Cst may be electrically connected to the second node N2. The capacitor Cst may be a storage capacitor for storing each data signal DS inside the pixel PX. For example, the capacitor Cst may be charged with a voltage corresponding to the data signal DS supplied to the first node N1 during each frame period.

The third transistor M3 may be electrically connected between the second node N2 and the initialization power line INL. A gate electrode of the third transistor M3 may be electrically connected to the control line SSL of the corresponding horizontal line.

The third transistor M3 may be electrically connected to the first electrode ET1 (for example, first electrode ET1 of the light emitting part EMU) of the corresponding pixel PX through the second node N2, and may be electrically connected to the first pad P1 through the initialization power line INL. For example, the third transistor M3 may be electrically connected between each first electrode ET1 and the first pad P1.

The third transistor M3 may be an initialization transistor that transmits the voltage of the initialization power source VINT to the first electrode ET1 of each pixel PX during the driving period of the display device DD. For example, the third transistor M3 may be electrically connected between the first pad P1 and the first electrode ET1 of the corresponding pixel PX to be turned on by the control signal SSC of the gate-on voltage supplied to the corresponding pixel row. In case that the third transistor M3 is turned on, the voltage of the initialization power source VINT applied to the first pad P1 during the driving period of the display device DD may be transmitted to each first electrode ET1.

In an embodiment, the scan signals SC of the gate-on voltage may be sequentially supplied to the scan lines SL of respective pixel rows arranged in the display area DA during the driving period of the display device DD. The control signals SSC of the gate-on voltage may be sequentially supplied to the control lines SSL of respective pixel rows to be synchronized with the scan signals SC of the gate-on voltage. Accordingly, in each horizontal period, the second and third transistors M2 and M3 of the pixels PX arranged in the corresponding horizontal line are turned on, so that voltages (for example, a voltage difference between the voltage of the data signal DS corresponding to each pixel PX and the voltage of the initialization power source VINT) corresponding to the respective data signals DS supplied to the respective data lines DL may be stored in respective capacitors Cst.

The third transistor M3 may be turned on by the control signal SSC of the gate-on voltage supplied to the corresponding pixel row during a sensing period for detecting the characteristic and the like of each pixel PX. In case that the third transistor M3 is turned on, the second node N2 may be electrically connected to the initialization power line INL. During the sensing period, the initialization power line INL may be electrically connected to a sensing circuit. Accordingly, the voltage of the second node N2 may be transmitted to the sensing circuit through the initialization power line INL. The voltage of the second node N2 transmitted to the initialization power line INL may be provided to a driving circuit (for example, a timing controller) via the sensing circuit to be used to compensate for characteristic deviation of the pixels PX.

In an embodiment, the control signals SSC of the gate-on voltage may be sequentially supplied to the control lines SSL of respective pixel rows arranged in the display area DA during the sensing period for detecting the characteristic and the like of the pixels PX. Accordingly, in each horizontal period, the second nodes N2 of pixels PX arranged in the corresponding pixel row may be electrically connected to the sensing circuit. Accordingly, the characteristic of the pixels PX may be detected through the initialization power line INL during the sensing period.

The third transistor M3 may be turned on by the control signal SSC of the gate-on voltage supplied to the corresponding pixel row during the inspection period of the display device DD, for example, the light emitting element inspection period. In case that the third transistor M3 is turned on, the voltage of the first power source VDD applied to the first pad P1 may be transmitted to each first electrode ET1 during the light emitting element inspection period. In an embodiment, the voltage of the first power source VDD applied to the first pad P1 during the light emitting element inspection period and the voltage of the first power source VDD applied to the first power pad PP1 during the driving period of the display device DD may be the same or different from each other.

In an embodiment, the third transistors M3 of the pixels PX sequentially arranged in the first direction DR1 may share the control line SSL disposed on the corresponding horizontal line, and may be simultaneously turned on by the control signal SSC of the gate-on voltage supplied to the control line SSL. The third transistors M3 of the pixels PX sequentially arranged in different pixel rows in the second direction DR2 may be electrically connected to different gate lines (for example, respective control lines SSL corresponding to respective pixel rows) to be sequentially turned on.

During the light emitting element inspection period, the light emitting elements LD of the pixels PX sequentially arranged in the second direction DR2 may be commonly and electrically connected to a second electrode ET2 disposed in the corresponding pixel column, and the second electrodes ET2 of the pixels PX sequentially arranged in the first direction DR1 may be separated from each other. Accordingly, during the light emitting element inspection period, in case that the control signals SSC having the gate-on voltage is sequentially applied to the respective pixel rows and the voltage of the second power source VSS is applied to respective second electrodes ET2 through respective second pads P2, defects caused by the light emitting elements LD of the pixels PX arranged in the corresponding pixel row may be individually detected.

For example, during the light emitting element inspection period, the voltage of the first power source VDD may be applied to the first electrodes ET1 of respective pixels PX through the first pad P1, the initialization power line INL, and respective third transistors M3, and the voltage of the second power source VSS may be applied to respective second electrodes ET2 through respective second pads P2. Accordingly, a current may flow through the light emitting elements LD of the pixels PX arranged in the pixel row. During the period in which the current flows through the light emitting elements LD of the corresponding pixel row, in case that the currents flowing through respective second pads P2 are detected, the pixel defects caused by the light emitting elements LD provided to the pixels PX of the corresponding pixel row may be individually detected.

In an embodiment, a gate-off voltage Voff by which the first transistors M1 of the pixels PX may be turned off may be applied to the data lines DL during the light emitting element inspection period. Accordingly, the influence of the pixel circuit PXC may be removed or minimized during the light emitting element inspection period, and the defects caused by the light emitting elements LD of the pixels PX may be effectively detected.

In an embodiment, in case that a defect is detected in at least one pixel PX during the light emitting element inspection period, a process of repairing the defective pixel PX may be followed after the light emitting element inspection is completed. For example, by repairing a defect occurring in the light emitting element LD itself of the pixel PX and/or a connection defect (for example, a bonding defect) of the light emitting element LD or by replacing the defective light emitting element LD, a defective pixel PX may be repaired. Accordingly, it is possible to improve the manufacturing efficiency of the display device DD.

FIG. 3 illustrates that all of the transistors M included in the pixel circuit PXC are illustrated as N-type transistors, but the disclosure is not limited thereto. For example, at least one of the first, second, and third transistors M1, M2, and M3 may be changed to a P-type transistor.

The structure and driving method of the pixel circuit PXC and/or the pixel PX may be variously changed according to embodiments. For example, the pixel circuit PXC may be configured as in the embodiment of FIG. 4. In describing the embodiment of FIG. 4, a duplicate description of a configuration similar to or the same as that of the embodiment of FIG. 3 will be omitted.

Referring to FIGS. 1 to 4, the pixel PX may be electrically connected to at least one scan line SL (or at least one gate line including the scan line SL) and a data line DL. For example, the pixel PX may be electrically connected to a first scan line SL1, a second scan line SL2, a third scan line SL3, a fourth scan line SL4, and the data line DL. The pixel PX may be electrically connected to a first power source VDD (or a first power pad PP1 which is electrically connected to the first power source VDD and to which a voltage of the first power source VDD is applied), a second power source VSS (or each second pad P2 which is electrically connected to the second power source VSS and to which a voltage of the second power source VSS is applied), and an initialization power line INL (for example, a wire which is electrically connected to the first pad P1 and to which a voltage of an initialization power source VINT is applied). In an embodiment, the pixel PX may further be electrically connected to at least one other signal line. For example, the pixel PX may be electrically connected to a light emitting control line ECL.

In an embodiment, the first scan line SL1, the second scan line SL2, the third scan line SL3, and the fourth scan line SL4 may be supplied with scan signals SC of the gate-on voltage at different time points. In this case, the first scan line SL1, the second scan line SL2, the third scan line SL3, and the fourth scan line SL4 may be separated from each other.

In another embodiment, at least two scan lines SL of the first scan line SL1, the second scan line SL2, the third scan line SL3, and the fourth scan line SL4 may be supplied with the scan signal SC of the gate-on voltage at a same time point, and they may be integrated into a wire. For example, the first scan line SL1 and the second scan line SL2 may be supplied with a first scan signal SC1 and a second scan signal SC2 of the gate-on voltage at a same time point. In this case, the first scan line SL1 and the second scan line SL2 may be integrated into a scan line SL, and the first scan signal SC1 and the second scan signal SC2 may be substantially the same scan signals SC.

In an embodiment, the first scan line SL1 and the second scan line SL2 may be scan lines SL for transmitting the first scan signal SC1 and the second scan signal SC2 (for example, a current scan signal) supplied as a gate-on voltage during a corresponding horizontal period to respective pixels PX, so as to supply respective data signals DS to the pixels PX of a corresponding horizontal line. The third scan line SL3 may be a scan line SL for transmitting a third scan signal SC3 (for example, a previous scan signal) supplied as a gate-on voltage before the first scan signal SC1 to respective pixels PX, so as to initialize the voltages of respective first nodes N1 before supplying respective data signals DS to the pixels PX of a corresponding horizontal line. The fourth scan line SL4 may be a scan line SL for transmitting a fourth scan signal SC4 supplied as a gate-on voltage to respective pixels PX, so as to transmit the voltage of the initialization power source VINT to respective second nodes N2, during a period for supplying respective data signals DS to the pixels PX of a corresponding horizontal line or before and after the period. The fourth scan line SL4 may be integrated with at least one of the first scan line SL1, the second scan line SL2, and the third scan line SL3, or may be separated from the first scan line SL1, the second scan line SL2, and the third scan line SL3.

In an embodiment, after respective scan signals SC are supplied to the first, second, third, and fourth scan lines SL1, SL2, SL3, and SL4, the light emitting control line ECL may be a control line for transmitting a light emitting control signal ES supplied as a gate-on voltage to respective pixels PX. For example, during the period in which the scan signals SC of the gate-on voltage are supplied to the first, second, third, and fourth scan lines SL1, SL2, SL3, and SL4, a light emitting control signal ES of a gate-off voltage may be supplied to the light emitting control line ECL. During each frame period, after the scan signals SC of the gate-on voltage are supplied to the first, second, third, and fourth scan lines SL1, SL2, SL3, and SL4 of the corresponding pixel row so that the voltage corresponding to each of the data signals DS is charged in the capacitor Cst, the light emitting control signal ES of the gate-on voltage may be supplied to the light emitting control line ECL of the corresponding pixel row. Accordingly, the pixels PX may emit light with a luminance corresponding to each of the data signals DS.

The pixel circuit PXC may include transistors M and at least one capacitor Cst. For example, the pixel circuit PXC may include a first transistor M1', a second transistor M2', a third transistor M3', a fourth transistor M4, a fifth transistor M5, a sixth transistor M6, a seventh transistor M7, and a capacitor Cst.

The first transistor M1' may be electrically connected between the first power source VDD and the second node N2. For example, an electrode (for example, a source electrode) of the first transistor M1' may be electrically connected to the first power source VDD via the fifth transistor M5 and the first power pad PP1, and another electrode (for example, a drain electrode) of the first transistor M1' may be electrically connected to the first electrode ET1 of the light emitting part EMU (for example, an anode electrode of the light emitting part EMU) via the sixth transistor M6. A gate electrode of the first transistor M1' may be electrically connected to a first node N1'. The first transistor M1' may be a driving transistor that controls a driving current supplied to the light emitting part EMU in response to a voltage of the first node N1'.

In an embodiment, the first transistor M1' may further include a bottom metal layer BML. In an embodiment, the bottom metal layer BML may be electrically connected to an electrode (for example, a source electrode) of the first transistor M1'.

The second transistor M2' may be electrically connected between the data line DL and an electrode (for example, the source electrode) of the first transistor M1'. A gate electrode of the second transistor M2' may be electrically connected to the first scan line SL1 of the corresponding horizontal line. The second transistor M2' may be turned on in case that the first scan signal SC1 of the gate-on voltage is supplied to the first scan line SL1, to electrically connect the data line DL to an electrode of the first transistor M1'. Accordingly, in case that the second transistor M2' is turned on, the data signal DS supplied from the data line DL may be transmitted to the first transistor M1'. In an embodiment, a gate-off voltage Voff by which the first transistors M1' of the pixels PX may be turned off may be applied to the data lines DL of respective pixel column during the light emitting element inspection period.

The third transistor M3' may be electrically connected between the other electrode (for example, the drain electrode) of the first transistor M1' and the first node N1'. A gate electrode of the third transistor M3' may be electrically connected to the second scan line SL2 (or the first scan line SL1) of the corresponding horizontal line. The third transistor M3' may be turned on in case that the second scan signal SC2 (or the first scan signal SC1) of the gate-on voltage is supplied from the second scan line SL2 (or the first scan line SL1), to connect the first transistor M1' in a diode form. Accordingly, during the period in which the second scan signal SC2 (or the first scan signal SC1) of the gate-on voltage is supplied, the first transistor M1' may be turned on in a diode-connected form. Accordingly, the data signal DS from the data line DL may be supplied to the first node N1' by sequentially passing through the second transistor M2', the first transistor M1', and the third transistor M3'. Accordingly, the capacitor Cst may be charged with voltages corresponding to the data signal DS and a threshold voltage of the first transistor M1'.

The fourth transistor M4 may be electrically connected between the first node N1' and the initialization power source VINT. A gate electrode of the fourth transistor M4 may be electrically connected to the third scan line SL3 of the corresponding horizontal line. The fourth transistor M4 may be turned on in case that the third scan signal SC3 of the gate-on voltage is supplied to the third scan line SL3 to transmit the voltage of the initialization power source VINT to the first node N1'.

In some embodiments, the voltage of the initialization power source VINT may be equal to or less than the lowest voltage of the data signal DS. Before the first scan signal SC1 of the gate-on voltage is supplied to each pixel PX, the third scan signal SC3 of the gate-on voltage may be supplied to the third scan line SL3. Accordingly, before the data signal DS of each frame is supplied to each pixel PX, the first node N1' may be initialized with the voltage of the initialization power source VINT. Accordingly, regardless of the voltage of the data signal DS of the previous frame, the first transistor M1' may be electrically diode-connected in a forward direction during the period in which the first scan signal SC1 of the gate-on voltage is supplied to the first scan line SL1. Accordingly, the data signal DS of the corresponding frame may be transmitted to the first node N1'.

The fifth transistor M5 may be electrically connected between the first power source VDD and the first transistor M1'. A gate electrode of the fifth transistor M5 may be electrically connected to the light emitting control line ECL of the corresponding horizontal line. The fifth transistor M5 may be turned off in case that the light emitting control signal ES of the gate-off voltage (for example, a logic low voltage, or a high-level voltage) is supplied to the light emitting control line ECL, and may be turned on in other cases.

The sixth transistor M6 may be electrically connected between the first transistor M1' and the second node N2. A gate electrode of the sixth transistor M6 may be electrically connected to the light emitting control line ECL of the corresponding horizontal line. The sixth transistor M6 may be turned off in case that the light emitting control signal ES of the gate-off voltage is supplied to the light emitting control line ECL, and may be turned on in other cases.

The fifth and sixth transistors M5 and M6 may control the light emitting period of the pixel PX. For example, in case that the fifth and sixth transistors M5 and M6 are turned on, a current path in which a driving current may sequentially pass through the first power source VDD, the fifth transistor M5, the first transistor M1', the sixth transistor M6, and the light emitting part EMU to flow into the second power source VSS, may be formed. In case that the fifth and/or sixth transistors M5 and/or M6 are turned off, the current path is blocked, and thus light emitting of the pixel PX may be prevented.

The seventh transistor M7 may be electrically connected between the second node N2 and the initialization power line INL. A gate electrode of the seventh transistor M7 may be electrically connected to the fourth scan line SL4 of the corresponding horizontal line.

The seventh transistor M7 may be electrically connected to the first electrode ET1 (for example, first electrode ET1 of the light emitting part EMU) of the corresponding pixel PX through the second node N2, and may be electrically connected to the first pad P1 through the initialization power line INL. For example, the seventh transistor M7 may be electrically connected between each first electrode ET1 and the first pad P1.

The seventh transistor M7 may be an initialization transistor that transmits the voltage of the initialization power source VINT to the first electrode ET1 of each pixel PX during the driving period of the display device DD. For example, the seventh transistor M7 may be electrically connected between the first pad P1 and the first electrode ET1 of the corresponding pixel PX to be turned on by the fourth scan signal SC4 of the gate-on voltage supplied to the fourth scan line SL4 of the corresponding pixel row. In case that the seventh transistor M7 is turned on, the voltage of the initialization power source VINT applied to the first pad P1 during the driving period of the display device DD may be transmitted to each first electrode ET1.

The seventh transistor M7 may be turned on by the fourth scan signal SC4 of the gate-on voltage supplied to the corresponding pixel row during the light emitting element inspection period. In case that the seventh transistor M7 is turned on, the voltage of the first power source VDD applied to the first pad P1 may be transmitted to each first electrode ET1 during the light emitting element inspection period.

In an embodiment, the seventh transistors M7 of the pixels PX sequentially arranged in the first direction DR1 may share the fourth scan line SL4 disposed on the corresponding horizontal line, and may be simultaneously turned on by the fourth scan signal SC4 of the gate-on voltage supplied to the fourth scan line SL4. The seventh transistors M7 of the pixels PX sequentially arranged in different pixel rows in the second direction DR2 may be electrically connected to different gate lines (for example, respective fourth scan lines SL4 corresponding to respective pixel rows) to be sequentially turned on.

During the light emitting element inspection period, the light emitting elements LD of the pixels PX sequentially arranged in the second direction DR2 may be commonly and electrically connected to a second electrode ET2 disposed in the corresponding pixel column, and the second electrodes ET2 of the pixels PX sequentially arranged in the first direction DR1 may be separated from each other. Accordingly, during the light emitting element inspection period, in case that the fourth scan signals SC4 of the gate-on voltage is sequentially applied to the respective pixel rows and the voltage of the second power source VSS is applied to respective second electrodes ET2 through respective second pads P2, defects caused by the light emitting elements LD of the pixels PX arranged in the corresponding pixel row may be individually detected.

In an embodiment, a gate-off voltage Voff by which the first transistors M1 of the pixels PX may be turned off may be applied to the data lines DL during the light emitting element inspection period. Accordingly, the influence of the pixel circuit PXC may be removed or minimized during the light emitting element inspection period, and the defects caused by the light emitting elements LD of the pixels PX may be effectively detected.

In an embodiment, in case that a defect is detected in at least one pixel PX during the light emitting element inspection period, a process of repairing the defective pixel PX may be performed after the light emitting element inspection is completed. Accordingly, it is possible to improve the manufacturing efficiency of the display device DD.

The scan signal SC for controlling the operation of the seventh transistor M7 and/or the initialization power source VINT may be variously changed. For example, in an embodiment, the gate electrode of the seventh transistor M7 may be electrically connected to the first scan line SL1 or the third scan line SL3 of the corresponding horizontal line. In this case, the seventh transistor M7 may be turned on by the first scan signal SC1 or the third scan signal SC3 of the gate-on voltage to supply the voltage of the initialization power source VINT to the first electrode ET1 of the light emitting part EMU. In some embodiments, the fourth transistor M4 and the seventh transistor M7 may be electrically connected to different initialization power sources having different potentials. For example, in some embodiments, the pixel PX may be electrically connected to at least two different initialization power sources, and the first node N1' and the first electrode ET1 of the light emitting part EMU may be initialized by the initialization power sources of different potentials.

The capacitor Cst may be electrically connected between the first power source VDD and the first node N1'. The capacitor Cst may be charged with voltages corresponding to the data signal DS supplied to the first node N1' and the threshold voltage of the first transistor M1' during each frame period.

FIG. 4 illustrates that all of the transistors M included in the pixel circuit PXC are P-type transistors, but the disclosure is not limited thereto. For example, at least one of the first transistor M1', the second transistor M2', the third transistor M3', the fourth transistor M4, the fifth transistor M5, the sixth transistor M6, and the seventh transistor M7 may be changed to an N-type transistor. In this case, the gate-on voltage (for example, a logic high voltage) for turning on the N-type transistor may be a high-level voltage.

The structure and driving method of the pixel PX may be variously changed according embodiments. For example, the pixel circuit PXC and/or the pixel PX may have various structures in addition to the structures according to the embodiments of FIGS. 3 and 4. The interconnection structure and/or operation timing of the transistors M and/or the capacitor Cst may be variously changed according to embodiments.

Figure 5:
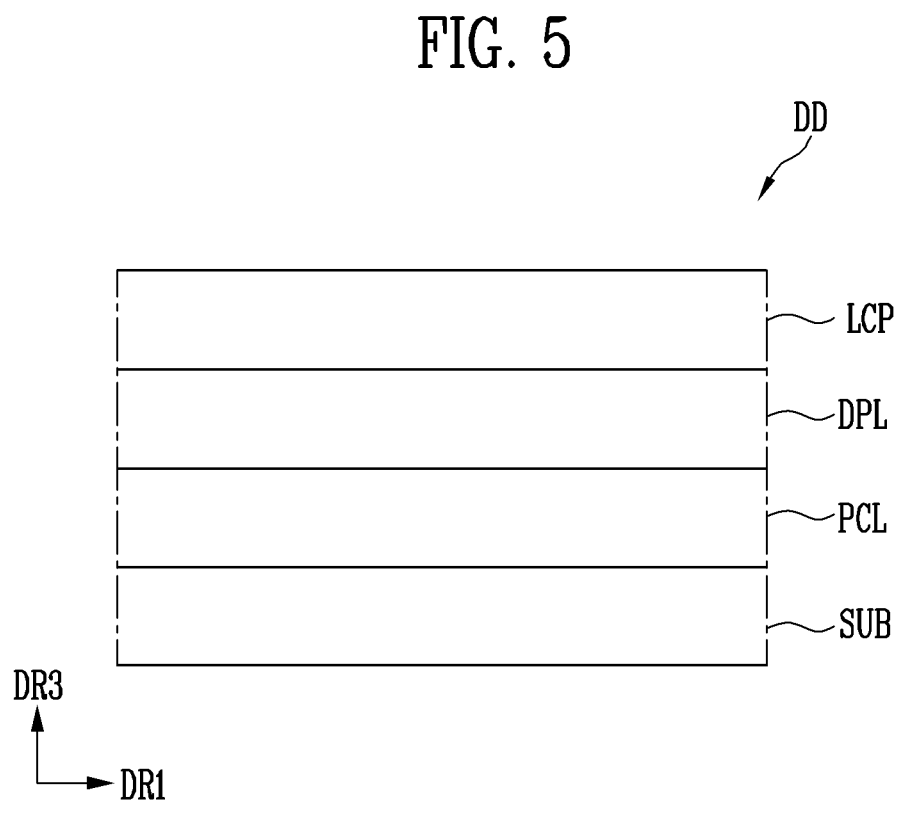

FIG. 5 illustrates a schematic cross-sectional view of a display device DD according to an embodiment.

Referring to FIGS. 1 to 5, the display device DD may include a substrate SUB, a pixel circuit part PCL, a display element part DPL, and a light controller (or light control part) LCP. In an embodiment, the substrate SUB, the pixel circuit part PCL, the display element part DPL, and the light controller LCP may be sequentially disposed in a display direction (for example, the third direction DR3) of the display device DD.

The substrate SUB may configure a base surface of the display device DD. Individual components of the display device DD may be disposed on the substrate SUB. For example, respective pixels PX may be disposed in pixel areas on the substrate SUB.

The pixel circuit part PCL may be disposed on the substrate SUB. The pixel circuit part PCL may include circuit elements configuring the pixel circuits PXC of the pixels PX, and wires electrically connected to the circuit elements. For example, the transistors M and the capacitor Cst configuring the pixel circuit PXC of the corresponding pixel PX may be disposed in each pixel area of the pixel circuit part PCL. The signal lines and/or the power lines electrically connected to the pixels PX may be disposed inside and/or around the pixel areas. In an embodiment, in case that the pixels PX do not include the pixel circuits PXC, the pixel circuit part PCL may include only the wires and/or the pads for supplying the driving signal and/or a voltage of the driving power source to the display element part DPL, or may be integrated with the display element part DPL.

The display element part DPL may be disposed on the pixel circuit part PCL. The display element part DPL may include the light emitting elements LD configuring the light emitting parts EMU of the pixels PX, and the electrodes and/or the wires electrically connected to the light emitting elements LD. For example, at least one light emitting element LD configuring the light emitting part EMU of each pixel PX may be provided in each pixel area, particularly a light emitting area, of the display element part DPL. The first electrode ET1, the second electrode ET2, and/or the wire electrically connected to the at least one light emitting element LD may be provided inside and/or around the light emitting area.

In an embodiment, the light emitting element LD provided in the light emitting part EMU of each pixel PX may be electrically connected to the pixel circuit PXC and at least one power line of the corresponding pixel PX. The light emitting element LD may emit light with a luminance corresponding to an electrical signal (for example, driving current) provided from the pixel circuit PXC. The light generated by the light emitting elements LD of the display element part DPL may pass through the light controller LCP to be emitted to the outside.

The light controller LCP may be disposed on the display element part DPL. In an embodiment, the light controller LCP may include color filters that selectively transmit light having a specific color and/or a wavelength band corresponding thereto. For example, the light controller LCP may include a color filter of a first color (hereinafter, referred to as a "first color filter") disposed on the first pixel PX1 (or inside the first pixel PX1), a color filter of a second color (hereinafter referred to as a "second color filter") disposed on the second pixel PX2 (or inside the second pixel PX2), and a color filter of a third color (hereinafter referred to as a "third color filter") disposed on the third pixel PX3 (or inside the third pixel PX3).

In an embodiment, the light controller LCP may further include additional components in addition to the color filters. For example, the light controller LCP may selectively further include a wavelength converting pattern including color conversion particles (for example, wavelength conversion particles), and/or a light transmission pattern including light scattering particles.

Figure 6:
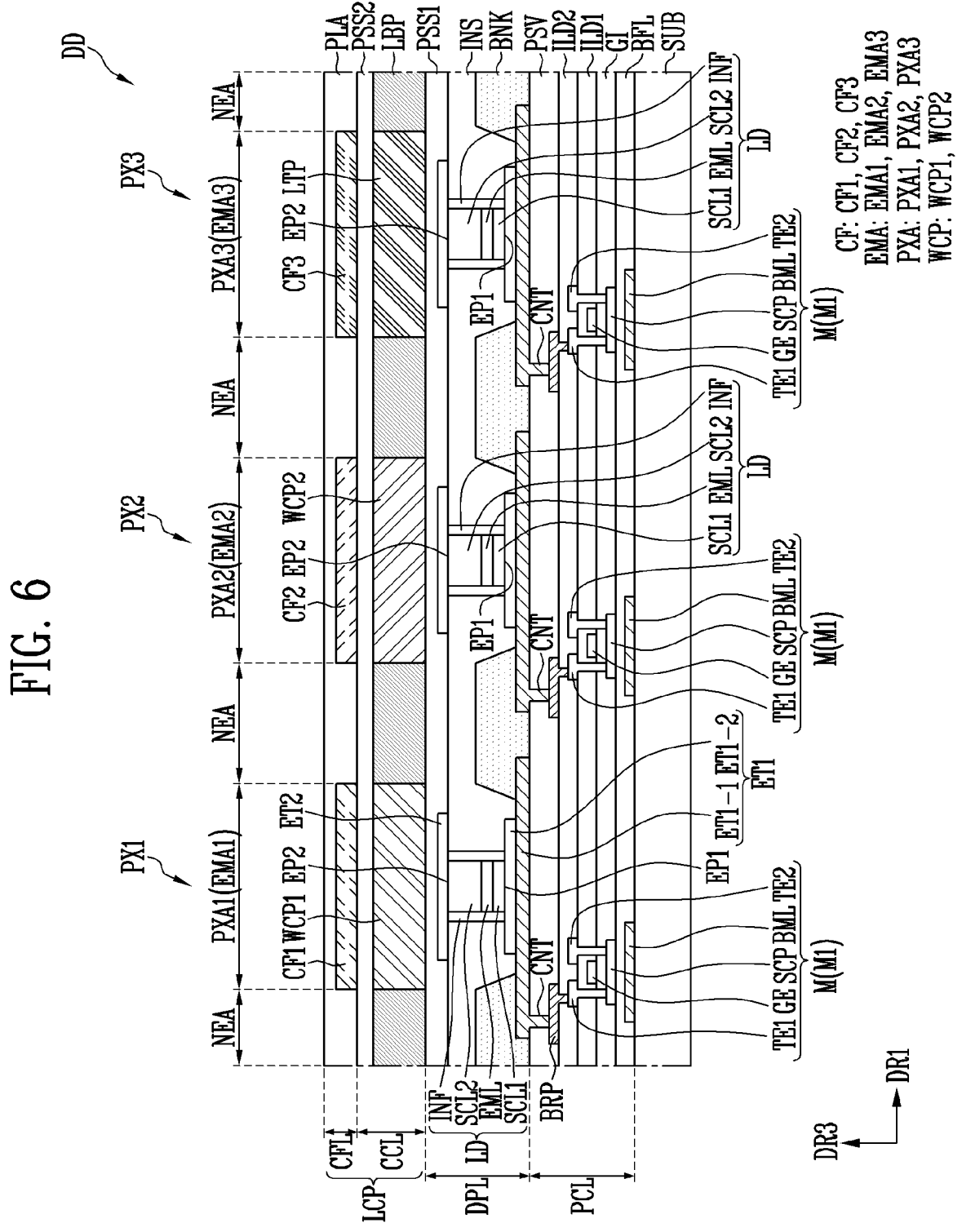
FIG. 6 illustrates a cross-sectional view of a display device according to an embodiment of the disclosure.

FIG. 6 illustrates a schematic cross-sectional view of a display device DD according to an embodiment. For example, FIG. 6 illustrates a schematic cross-sectional view of a portion of the display device DD according to the embodiment of FIG. 1 or 2, and as an example, illustrates a schematic cross-sectional view of the display device DD in a portion of the display area DA in which a pixel group PXG is disposed.

FIG. 6 illustrates a transistor M electrically connected to each light emitting element LD (for example, the first transistor M1 including the bottom metal layer BML), as an example of the circuit elements that may be provided in each pixel area PXA of the pixel circuit part PCL. The pixel circuit part PCL may further include wires electrically connected to the circuit elements and/or the light emitting elements LD of the display element part DPL.

For convenience, FIG. 6 illustrates the pixel area PXA in which the pixel PX is disposed based on a light emitting area EMA of each pixel PX. However, each pixel area PXA may include a pixel circuit area in which circuit elements configuring each pixel circuit PXC are disposed, and a light emitting area EMA in which at least one light emitting element LD configuring each light emitting part EMU is disposed. For example, a first pixel area PXA1 in which a first pixel PX1 is disposed may include at least a first light emitting area EMA1, and may optionally further include a portion of a non-light emitting area NEA disposed around the first light emitting area EMA1. Similarly, a second pixel area PXA2 in which a second pixel PX2 is disposed may include at least a second light emitting area EMA2, and may optionally further include a portion of the non-light emitting area NEA disposed around the second light emitting area EMA2. A third pixel area PXA3 in which a third pixel PX3 is disposed may include at least a third light emitting area EMA3, and may optionally further include a portion of the non-light emitting area NEA disposed around the third light emitting area EMA3. In an embodiment, the light emitting area EMA of each pixel PX may overlap the pixel circuit area of the corresponding pixel PX, but the disclosure is not limited thereto.

Referring to FIGS. 1 to 6, the display device DD may include a substrate SUB, and a pixel circuit part PCL, a display element part DPL, and a light controller LCP that are sequentially disposed on the substrate SUB.

The substrate SUB may be a rigid substrate or a flexible substrate or film, and a material or structure thereof is not particularly limited. For example, the substrate SUB may be an insulation substrate or insulation film such as a glass substrate or a polymer film, and may be a single-layered or multi-layered substrate or film.

The pixel circuit part PCL may be provided on a surface of the substrate SUB. The pixel circuit part PCL may include circuit elements configuring each pixel PX. For example, the transistors M and the capacitor Cst configuring the pixel circuit PXC of the corresponding pixel PX may be formed in each pixel area PXA of the pixel circuit part PCL.

The pixel circuit part PCL may include various signal lines, power lines, and/or pads electrically connected to the pixels PX. For example, the pixel circuit part PCL may include the scan lines SL, the control lines SSL, the light emitting control lines ECL, the data lines DL, and/or the initialization power line INL (for example, a power line electrically connected to the first pad P1). The pixel circuit part PCL may include a first power line electrically connected between the first power pad PP1 and the pixel circuits PXC. The pixel circuit part PCL may include pads including the first pad P1, the first power pad PP1, the signal pads SP, and/or the second pads P2, in the first pad part PA1 and/or the second pad part PA2 of the non-display area NA.

The pixel circuit part PCL may further include insulating layers. For example, the pixel circuit part PCL may include a buffer layer BFL, a gate insulating layer GI, a first interlayer insulating layer ILD1, a second interlayer insulating layer ILD2, and/or a passivation layer PSV that are sequentially disposed on a surface of the substrate SUB.

The pixel circuit part PCL may selectively include a first conductive layer disposed on the substrate SUB. The first conductive layer may be disposed between the substrate SUB and the buffer layer BFL, and may include bottom metal layers BML of the first transistors M1 included in the pixels PX.

The first conductive layer may further include at least one wire and/or a bridge pattern. For example, the first conductive layer may include at least some of wires extending from the display area DA in the second direction DR2 (or first direction DR1).

The buffer layer BFL may be disposed on a surface of the substrate SUB including the first conductive layer. The buffer layer BFL may prevent impurities from diffusing into each circuit element.

A semiconductor layer may be disposed on the buffer layer BFL. The semiconductor layer may include semiconductor patterns SCP of the transistors M. Each semiconductor pattern SCP may include a channel area overlapping a gate electrode GE of the corresponding transistor M, and first and second conductive areas (for example, source and drain areas) disposed at both sides of the channel area. Each semiconductor pattern SCP may be a semiconductor pattern made of polysilicon, amorphous silicon, or an oxide semiconductor.

The gate insulating layer GI may be disposed on the semiconductor layer. A second conductive layer may be disposed on the gate insulating layer GI.

The second conductive layer may include the gate electrodes GE of the transistors M. The second conductive layer may further include first electrodes of the capacitors Cst and/or a bridge pattern. Additionally, in case that at least one power and/or signal line disposed in the display area DA is configured of multiple layers, the second conductive layer may further include at least one conductive pattern configuring the at least one power line and/or signal line.

The first interlayer insulating layer ILD1 may be disposed on the second conductive layer. A third conductive layer may be disposed on the first interlayer insulating layer ILD1.

The third conductive layer may include source electrodes TE1 and drain electrodes TE2 of the transistors M. Each source electrode TE1 (also referred to as a "first transistor electrode") may be electrically connected to a portion (for example, a source area) of the semiconductor pattern SCP included in the corresponding transistor M through a contact hole or the like, and each drain electrode TE2 (also referred to as a "second transistor electrode") may be electrically connected to another area (for example, a drain area) of the semiconductor pattern SCP included in the corresponding transistor M through another contact hole or the like.

Although FIG. 6 illustrates an embodiment in which the source electrodes TE1 and the drain electrodes TE2 of the transistors M are formed separately from the respective semiconductor patterns SCP, the disclosure is not limited thereto. For example, in an embodiment, the source electrode TE1 and/or the drain electrode TE2 of at least one transistor M may be integrally formed with (or may be integral with) the semiconductor pattern SCP. For example, each of the source electrode TE1 and the drain electrode TE2 may be formed by doping different portions of the semiconductor pattern SCP with a high concentration of dopant.

The third conductive layer may further include an electrode of each of the capacitors Cst, at least one wire, and/or a bridge pattern. For example, the third conductive layer may include at least some of wires extending from the display area DA in the first direction DR1 (or second direction DR2). In case that at least one power line and/or signal line disposed in the display area DA is configured of multiple layers, the third conductive layer may further include at least one conductive pattern configuring the at least one power line and/or signal line.

In an embodiment, the pixel circuit part PCL may optionally further include the second interlayer insulating layer ILD2 and a fourth conductive layer disposed on the second interlayer insulating layer ILD2. For example, the second interlayer insulating layer ILD2 may be disposed on the third conductive layer. The fourth conductive layer may be disposed on the second interlayer insulating layer ILD2.

The fourth conductive layer may include at least one bridge pattern and/or wire. For example, the fourth conductive layer may include at least one circuit element (for example, the first transistor M1) provided in the pixel circuit PXC of each pixel PX, and each bridge pattern BRP for electrically connecting the first electrodes ET1 provided in the light emitting part EMU of the pixel PX to each other. For example, each bridge pattern BRP may be electrically connected to the first transistor electrode TE1 of the first transistor M1 through a contact hole penetrating the second interlayer insulating layer ILD2. Each bridge pattern BRP may be electrically connected to the first electrode ET1 of the corresponding pixel PX through a contact part CNT formed in the passivation layer PSV. Each contact part CNT may include at least one contact hole or a via hole in the passivation layer PSV.

Each of the conductive pattern, the electrode, and the wire configuring the first to fourth conductive layers may have conductivity by including at least one conductive material, but the configuration material thereof is not particularly limited. For example, each of the conductive pattern, the electrode, and the wire configuring the first to fourth conductive layers may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and in addition, it may include various types of conductive materials. Each of the conductive pattern, the electrode, and the wire configuring the first to fourth conductive layers may be provided as a single layer or multilayer, and the cross-section structure thereof is not particularly limited.

The passivation layer PSV may be disposed on the fourth conductive layer. Each of the buffer layer BFL, the gate insulating layer GI, the first interlayer insulating layer ILD1, the second interlayer insulating layer ILD2, and passivation layer PSV may be formed as a single layer or multilayer, and may include at least one inorganic insulating material and/or organic insulating material. For example, each of the buffer layer BFL, the gate insulating layer GI, the first interlayer insulating layer ILD1, the second interlayer insulating layer ILD2, and passivation layer PSV may include various types of organic/inorganic insulating materials in addition to a silicon nitride ($SiN_x$) (for example, $Si_3N_4$), a silicon oxide ($SiO_x$) (for example, $SiO_2$), or a silicon oxynitride ($SiO_xN_y$). In an embodiment, the passivation layer PSV may include an organic insulating layer and may planarize a surface of the pixel circuit part PCL.

The display element part DPL may be disposed on the passivation layer PSV.

The display element part DPL may include the light emitting parts EMU including the first electrodes ET1, the light emitting elements LD, and the second electrodes ET2. The display element part DPL may further include a bank BNK and/or an insulating layer INS disposed around the light emitting elements LD, and a first passivation layer PSS1 covering (or overlapping in a plan view) the light emitting parts EMU.

For example, in each pixel area PXA of the display element part DPL, at least one light emitting element LD configuring the light emitting part EMU of the corresponding pixel PX, and the first electrode ET1 and the second electrode ET2 electrically connected to the light emitting element LD may be disposed. As an example, the display element part DPL may include the first electrode ET1 disposed in a light emitting area (hereinafter, referred to as a "first light emitting area EMA1") of the first pixel PX1 and at least one light emitting element LD disposed on the first electrode ET1, the first electrode ET1 disposed in a light emitting area (hereinafter, referred to as a "second light emitting area EMA2") of the second pixel PX2 and at least one light emitting element LD disposed on the first electrode ET1, the first electrode ET1 disposed in a light emitting area (hereinafter, referred to as a "a third light emitting area EMA3") of the third pixel PX3 and at least one light emitting element LD disposed on the first electrode ET1, and the second electrodes ET2 disposed on the light emitting elements LD of each pixel column.

The first electrode ET1 of each pixel PX may be disposed on the pixel circuit part PCL to be positioned in each light emitting area EMA. For example, the first electrode ET1 of the first pixel PX1 may be disposed on the pixel circuit part PCL to be positioned in the first light emitting area EMA1, the first electrode ET1 of the second pixel PX2 may be disposed on the pixel circuit part PCL to be positioned in the second light emitting area EMA2, and the first electrode ET1 of the third pixel PX3 may be disposed on the pixel circuit part PCL to be positioned in the third light emitting area EMA3. In an embodiment, each first electrode ET1 may be an anode electrode provided in the corresponding pixel PX (or the light emitting part EMU of the corresponding pixel PX). The first electrodes ET1 of the pixels PX may be separated from each other.

Each first electrode ET1 may be electrically connected to at least one circuit element configuring the pixel circuit PXC of the corresponding pixel PX. For example, the first electrode ET1 of the first pixel PX1 may be electrically connected to at least one circuit element (for example, the first transistor M1 of the first pixel PX1) configuring the pixel circuit PXC of the first pixel PX1. Similarly, the first electrode ET1 of the second pixel PX2 may be electrically connected to at least one circuit element (for example, the first transistor M1 of the second pixel PX2) configuring the pixel circuit PXC of the second pixel PX2, and the first electrode ET1 of the third pixel PX3 may be electrically connected to at least one circuit element (for example, the first transistor M1 of the third pixel PX3) configuring the pixel circuit PXC of the third pixel PX3.

The first electrodes ET1 may be disposed on the passivation layer PSV. The first electrodes ET1 may be electrically connected to respective bridge patterns BRP through respective contact parts CNT.

Each of the first electrodes ET1 may be disposed under the light emitting element LD provided in the corresponding pixel PX, and may be electrically connected to the light emitting element LD. For example, each first electrode ET1 may contact (or may be in contact with) a first end portion EP1 of the light emitting element LD provided in the corresponding pixel PX to be electrically connected to the first end portion EP1 of the light emitting element LD. In an embodiment, the first end portion EP1 may be a portion of the light emitting element LD including a first semiconductor layer SCL1 of the light emitting element LD and/or at least one electrode layer provided therearound.

Each first electrode ET1 may transmit an electrical signal provided through the pixel circuit PXC of the corresponding pixel PX to the first end portion EP1 of the light emitting element LD. For example, the first electrode ET1 may transmit the voltage of the first power source VDD supplied through each pixel circuit PXC to the first semiconductor layer SCL1 of the light emitting element LD provided in the corresponding pixel PX.

In an embodiment, each first electrode ET1 may be configured as a multi-layered electrode including a first sub-electrode ET1-1 and a second sub-electrode ET1-2 sequentially disposed on the passivation layer PSV. For example, the first sub-electrode ET1-1 may be disposed on the passivation layer PSV, and the second sub-electrode ET1-2 may be disposed between the first sub-electrode ET1-1 and the light emitting element LD. In an embodiment, the second sub-electrodes ET1-2 may include a bonding metal that is bonded to each light emitting element LD.

Each of the first sub-electrode ET1-1 and the second sub-electrode ET1-2 may have conductivity by including at least one conductive material, and the material thereof is not particularly limited. For example, each of the first sub-electrode ET1-1 and the second sub-electrode ET1-2 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), or other conductive material(s).

In an embodiment, at least one of the first sub-electrode ET1-1 and the second sub-electrode ET1-2 may include a reflective conductive material. For example, at least one of the first sub-electrode ET1-1 and the second sub-electrode ET1-2 may be formed as a metal film including a metal having a high reflectance in a visible light wavelength band, for example, at least one of reflective metals including aluminum (Al), gold (Au), and silver (Ag). Accordingly, the light efficiency of the pixels PX may be increased.

The light emitting elements LD of the corresponding pixels PX may be disposed on the first electrodes ET1. In an embodiment, the light emitting elements LD may be disposed directly on respective first electrodes ET1 to be electrically connected to respective first electrodes ET1.

Each light emitting element LD includes a light emitting stack including a first semiconductor layer SCL1, a light emitting layer EML (also referred to as an "active layer"), and a second semiconductor layer SCL2 sequentially disposed on each first electrode ET1. For example, the light emitting element LD may include the first semiconductor layer SCL1, the light emitting layer EML, and the second semiconductor layer SCL2 that are sequentially stacked in a direction from the first end portion EP1 adjacent to each first electrode ET1 to a second end portion EP2 adjacent to each second electrode ET2.

In an embodiment, the first end portion EP1 may include a first bottom surface (or lower surface) of the light emitting element LD and/or a peripheral portion thereof. For example, the first end portion EP1 may include the first semiconductor layer SCL1 and/or a peripheral portion thereof. In an embodiment, the first end portion EP1 may contact one (for example, the first electrode ET1 of the corresponding pixel PX) of the first electrodes ET1 corresponding to the corresponding light emitting element LD, and may be electrically connected to the one first electrode ET1.

In an embodiment, the second end portion EP2 may include a second bottom surface (or upper surface) of the light emitting element LD and/or a peripheral area thereof. For example, the second end portion EP2 may include a portion in which the second semiconductor layer SCL2 is disposed. In an embodiment, the second end portion EP2 may contact one (for example, the second electrode ET2 of the corresponding pixel PX) of the second electrodes ET2 corresponding to the corresponding light emitting element LD, and may be electrically connected to the one second electrode ET2.

In an embodiment, each light emitting element LD may be manufactured in a pillar shape by an etching method or the like, and then bonded onto each of the first electrodes ET1. In describing the embodiments, the pillar shape includes a rod-like shape or bar-like shape such as a circular pillar or a polygonal pillar, and a shape of a cross-section thereof is not particularly limited.

In an embodiment, the light emitting element LD may have a size as small as nano-scale or micro-scale. However, the size of the light emitting element LD is not limited thereto.

The first semiconductor layer SCL1 may include a first conductive type of semiconductor layer including a first conductive dopant. For example, the first semiconductor layer SCL1 may be a P-type semiconductor layer including a P-type dopant. In an embodiment, the first semiconductor layer SCL1 may be positioned at the first end portion EP1 of the light emitting element LD.

In an embodiment, the first semiconductor layer SCL1 may include a nitride-based semiconductor material or a phosphide-based semiconductor material. For example, the first semiconductor layer SCL1 may include a nitride-based semiconductor material including at least one of GaN, AlGaN, InGaN, AlInGaN, AlN, and InN, or a phosphide-based semiconductor material including at least one of GaP, GaInP, AlGaP, AlGaInP, AlP, and InP. In an embodiment, the first semiconductor layer SCL1 may include a P-type dopant such as Mg. The material included in the first semiconductor layer SCL1 is not limited thereto, and in addition, various materials may be used to form the first semiconductor layer SCL1.

The light emitting layer EML may be interposed between the first semiconductor layer SCL1 and the second semiconductor layer SCL2. The light emitting layer EML may include a single or multiple quantum well structure. In an embodiment, in case that the light emitting layer EML is formed in a multi-quantum well structure, the light emitting layer EML may have a structure in which a barrier layer, a strain reinforcing layer, and a well layer are periodically and/or repeatedly stacked as one unit. However, the structure of the light emitting layer EML is not limited to the above-described embodiment.

In case that a threshold voltage or a voltage of more is applied to both ends (or end portions) of the light emitting element LD, light may be emitted while electron-hole pairs are recombined with each other in the light emitting layer EML. For example, in case that an electrical signal is applied to the light emitting layer EML through the first semiconductor layer SCL1 and the second semiconductor layer SCL2, electron-hole pairs are recombined with each other in the light emitting layer EML, and thus light of a specific color and a corresponding wavelength band may be emitted.

In an embodiment, the light emitting layer EML may emit light of a visible ray wavelength band, for example, light having a wavelength of about 400 nm to about 900 nm. For example, the light emitting layer EML may emit blue light having a wavelength ranging from about 450 nm to about 480 nm, green light having a wavelength ranging from about 480 nm to about 560 nm, or red light having a wavelength ranging from about 620 nm to about 750 nm. The color and/or wavelength band of the light generated by the light emitting layer EML may be changed.

In an embodiment, the light emitting layer EML may include a nitride-based semiconductor material or a phosphide-based semiconductor material. For example, the light emitting layer EML may include a nitride-based semiconductor material including at least one of GaN, AlGaN, InGaN, InGaAlN, AlN, InN, and AlInN, or a phosphide-based semiconductor material including at least one of GaP, GaInP, AlGaP, AlGaInP, AlP, and InP. The material forming the light emitting layer EML is not limited thereto, and in addition, various materials may be used to form the light emitting layer EML.

The second semiconductor layer SCL2 may include a second conductive semiconductor layer including a second conductive dopant. For example, the second semiconductor layer SCL2 may be an N-type semiconductor layer including an N-type dopant. In an embodiment, the second semiconductor layer SCL2 may be positioned at the second end portion EP2 of the light emitting element LD.

In an embodiment, the second semiconductor layer SCL2 may include a nitride-based semiconductor material or a phosphide-based semiconductor material. For example, the second semiconductor layer SCL2 may include a nitride-based semiconductor material including at least one of GaN, AlGaN, InGaN, AlInGaN, AlN, and InN, or a phosphide-based semiconductor material including at least one of GaP, GaInP, AlGaP, AlGaInP, AlP, and InP. In an embodiment, the second semiconductor layer SCL2 may include an N-type dopant such as Si, Ge, Sn, or the like. The material forming the second semiconductor layer SCL2 is not limited thereto, and in addition, various materials may be used to form the second semiconductor layer SCL2.

In an embodiment, the first semiconductor layer SCL1 and the second semiconductor layer SCL2 may include a same semiconductor material, but may include dopants of different conductive types. In an embodiment, the first semiconductor layer SCL1 and the second semiconductor layer SCL2 may include different semiconductor materials, and may include dopants of different conductive types.

In an embodiment, the first semiconductor layer SCL1 and the second semiconductor layer SCL2 may have different thicknesses (or lengths) in the third direction DR3. For example, in the third direction DR3, the second semiconductor layer SCL2 may have a thickness greater than that of the first semiconductor layer SCL1. Accordingly, the light emitting layer EML may be positioned closer to the first end portion EP1 (for example, a P-type end portion) than the second end portion EP2 (for example, an N-type end portion).

The second semiconductor layer SCL2 may be disposed under the second electrode ET2 of each pixel PX and may be electrically connected to the second electrode ET2. In case that the pixels PX arranged in each pixel column share one second electrode ET2, the second semiconductor layers SCL2 provided in the light emitting elements LD of the pixels PX arranged in each pixel column may be commonly and electrically connected to the one second electrode ET2.

Each light emitting element LD may further include an insulating film INF surrounding an external circumferential surface (for example, a side surface) of the light emitting stack. For example, each light emitting element LD may further include the insulating film INF provided on the surface of the light emitting element LD to surround the side surfaces of the first semiconductor layer SCL1, the light emitting layer EML, and the second semiconductor layer SCL2. As respective insulating films INF are provided on the surface of the light emitting elements LD, it is possible to reduce or prevent surface defects of the light emitting elements LD and prevent short circuit defects resulting from the light emitting elements LD.

The insulating film INF may expose at least a portion of the light emitting stack at the first end portion EP1 and the second end portion EP2. Accordingly, the light emitting element LD may be electrically connected to each of the first electrode ET1 and the second electrode ET2.

The insulating film INF may include a transparent insulating material. Accordingly, light generated in each light emitting layer EML may transmit through the insulating film INF to be emitted to the outside of the light emitting element LD. For example, the insulating film INF may include at least one insulating material of a silicon oxide ($SiO_x$), a silicon nitride ($SiN_x$), an aluminum oxide ($Al_xO_y$) (for example, $Al_2O_3$), a titanium oxide ($Ti_xO_y$) (for example, $TiO_2$), and a hafnium oxide ($HfO_x$), but the disclosure is not limited thereto. The insulating film INF may be configured as a single layer or multilayer.

In an embodiment, the light emitting element LD may further include an additional element. For example, the light emitting element LD may additionally include at least one phosphor layer, at least one semiconductor layer, and/or at least one electrode layer provided on one surfaces (or first surfaces) of the first semiconductor layer SCL1, the light emitting layer EML, and/or the second semiconductor layer SCL2.

The bank BNK may be disposed in the non-light emitting area NEA to be positioned between the light emitting areas EMA of the pixels PX. For example, the bank BNK may be disposed in outer portions of the pixels PX and/or in a portion between adjacent pixels PX. In an embodiment, the bank BNK may be formed in a mesh-like pattern having openings corresponding to respective light emitting areas EMA of the pixels PX in a plan view.

In an embodiment, the bank BNK may be formed with a height equal to or less than a height of the light emitting elements LD. The height of the bank BNK may be set in consideration of light emitting characteristics (for example, light divergence angle) of the light emitting elements LD and/or efficiency of a subsequent process, and may be variously changed according to embodiments.

The bank BNK may include at least one light blocking and/or at least one reflective material. For example, the bank BNK may include at least one black matrix material and/or a color filter material of a specific color, and may also include various materials.

The insulating layer INS may be disposed on the passivation layer PSV. The insulating layer INS may cover at least a portion of the first electrode ET1. The insulating layer INS may be provided between the light emitting elements LD disposed on respective first electrodes ET1 (for example, bonded onto the first electrodes ET1). Accordingly, the external circumferential surface (for example, the side surface) of the light emitting element LD may be covered by the insulating layer INS. In an embodiment, the insulating layer INS may include a low refractive index filler filled between the light emitting elements LD.

The insulating layer INS may include at least one insulating material, but the material or structure of the insulating layer INS is not particularly limited. For example, the insulating layer INS may include at least one insulating material of a silicon oxide ($SiO_x$), a silicon nitride ($SiN_x$), an aluminum oxide ($Al_xO_y$) (for example, $Al_2O_3$), a titanium oxide ($Ti_xO_y$) (for example, $TiO_2$), and a hafnium oxide ($HfO_x$), but the disclosure is not limited thereto. The insulating layer INS may be configured as a single layer or multilayer.

The second electrodes ET2 may be disposed on the insulating layer INS. The second electrodes ET2 may be arranged in the first direction DR1, and each thereof may extend in the second direction DR2. For example, the pixels PX of each pixel column may share a second electrode ET2.

Each second electrode ET2 may be disposed on upper portions of the light emitting elements LD provided in the pixels PX of each pixel column. Each second electrode ET2 may be electrically connected to the second semiconductor layers SCL2 of the light emitting elements LD of the corresponding pixel column. For example, each second electrode ET2 may be disposed directly on the light emitting elements LD of the pixels PX sequentially arranged in the corresponding pixel column in the second direction DR2. For example, each second electrode ET2 may be directly formed on the second semiconductor layers SCL2 of the light emitting elements LD disposed in the corresponding pixel column to be electrically connected to the second semiconductor layers SCL2. As another example, each second electrode ET2 may be electrically connected to the second semiconductor layers SCL2 of the light emitting elements LD disposed in the corresponding pixel column via at least one electrode layer or the like.

The second electrodes ET2 may transmit the voltage of the second power source VSS applied from respective second pads P2 to the second end portions EP2 of the light emitting elements LD during the light emitting element inspection period. Accordingly, the voltage of the second power source VSS may be supplied to the second semiconductor layers SCL2 of the light emitting elements LD during the light emitting element inspection period.

In an embodiment, the second electrodes ET2 may receive the voltage of the second power source VSS from respective second pads P2 even during the driving period of the display device DD. For example, the second pad part PA2 may be electrically connected to at least one circuit board or the like by a bonding process or the like, and the voltage of the second power source VSS may be supplied to the second pads P2 through the circuit board. Accordingly, the voltage of the second power source VSS may be supplied to the second semiconductor layers SCL2 of the light emitting elements LD during the driving period of the display device DD.

In another embodiment, the second electrodes ET2 may be electrically connected to at least one pad provided in the first pad part PA1 and at least one wire provided in the pixel circuit part PCL, and may be supplied with the voltage of the second power source VSS through the at least one pad and the at least one wire during the driving period of the display device DD. For example, the second electrodes ET2 may be supplied with the voltage of the second power source VSS through the second pads P2 or not through the second pads P2 during the driving period of the display device DD.

Each second electrode ET2 may have conductivity by including at least one conductive material. In an embodiment, the second electrode ET2 may include a transparent conductive material. For example, the second electrode ET2 may include at least one material of a conductive oxide such as an indium tin oxide (ITO), an indium zinc oxide (IZO), a zinc oxide (ZnO or $ZnO_2$), an indium gallium zinc oxide (IGZO), or an indium tin zinc oxide (ITZO) and a conductive polymer such as poly(3,4-ethylenedioxythiophene) (PEDOT), or other transparent conductive material. The second electrode ET2 may be substantially transparent. Accordingly, light output efficiency (for example, a front light output rate) of light generated by each light emitting element LD may be increased. The second electrode ET2 may be configured of a single layer or multilayer, and the shape, structure, and/or size thereof are not particularly limited.

A first passivation layer PSS1 may be disposed on the second electrodes ET2. In an embodiment, the first passivation layer PSS1 may include at least one insulating material and may be configured of a single layer or multilayer. For example, the first passivation layer PSS1 may include an organic insulating material and may substantially planarize the surface of the display element part DPL.

The light controller LCP may be disposed on the display element part DPL. The light controller LCP may be disposed on a path where light generated from the light emitting elements LD is emitted.

In an embodiment, the light controller LCP may include a color filter part CFL. The light controller LCP may selectively further include a color converter (or color converting part) CCL. For example, the light emitting elements LD emitting light of a third color (for example, blue color) may be disposed in the first pixel PX1, the second pixel PX2, and the third pixel PX3, and a first wavelength converting pattern WCP1 and a second wavelength converting pattern WCP2 respectively including first color converting particles and second color converting particles may be provided in the first pixel PX1 and the second pixel PX2, respectively. Accordingly, a full-color image may be displayed in the display area DA. However, the disclosure is not limited thereto. For example, in an embodiment, the first pixel PX1, the second pixel PX2, and the third pixel PX3 may include the light emitting elements LD emitting light of different colors. For example, the first pixel PX1, the second pixel PX2, and the third pixel PX3 may include red, green, and blue light emitting elements LD, respectively.

The color converter CCL may be disposed on the first passivation layer PSS1. In an embodiment, at least one passivation layer and/or adhesive layer or the like may be provided between the color converter CCL and the first passivation layer PSS1.

The color converter CCL may include a wavelength converting pattern WCP, a light transmitting pattern LTP, a light blocking pattern LBP, and a second passivation layer PSS2. The wavelength converting pattern WCP may include the first wavelength converting pattern WCP1 and the second wavelength converting pattern WCP2.

The first wavelength converting pattern WCP1 may be disposed to overlap the light emitting area EMA of the first pixel PX1 (for example, the first light emitting area EMA1). For example, the first wavelength converting pattern WCP1 may be disposed in a space defined by the light blocking pattern LBP and may overlap the first light emitting area EMA1 in a plan view.

The second wavelength converting pattern WCP2 may be disposed to overlap the light emitting area EMA of the second pixel PX2 (for example, the second light emitting area EMA2). For example, the second wavelength converting pattern WCP2 may be disposed in a space defined by the light blocking pattern LBP and may overlap the second light emitting area EMA2 in a plan view.

The light transmitting pattern LTP may be disposed to overlap the light emitting area EMA of the third pixel PX3 (for example, the third light emitting area EMA3). For example, the light transmitting pattern LTP may be disposed in a space defined by the light blocking pattern LBP and may overlap the third light emitting area EMA3 in a plan view.

In an embodiment, the light blocking pattern LBP may include openings corresponding to respective light emitting areas EMA (for example, the first, second, and third light emitting areas EMA1, EMA2, and EMA3). Each first wavelength converting pattern WCP1 may be disposed within the opening of the light blocking pattern LBP in an area corresponding to each first light emitting area EMA1. Each second wavelength converting pattern WCP2 may be disposed within the opening of the light blocking pattern LBP in a portion corresponding to each second light emitting area EMA2. Each light transmitting pattern LTP may be disposed within the opening of the light blocking pattern LBP in an area corresponding to each third light emitting area EMA3.

The first wavelength converting pattern WCP1 may include first color converting particles that convert the light of the third color emitted from the light emitting element LD provided in the first light emitting area EMA1 into light of the first color. For example, in case that the light emitting element LD provided in the first light emitting area EMA1 is a blue light emitting element emitting blue light and the first pixel PX1 is a red pixel, the first wavelength converting pattern WCP1 may include a first quantum dot (for example, a red quantum dot) that converts blue light emitted from the blue light emitting element into red light. The type of the first color converting particles and the color and/or wavelength of light converted in the first wavelength converting pattern WCP1 may be variously changed according to embodiments.

The second wavelength converting pattern WCP2 may include second color converting particles that convert the light of the third color emitted from the light emitting element LD provided in the second light emitting area EMA2 into light of the second color. For example, in case that the light emitting element LD provided in the second light emitting area EMA2 is a blue light emitting element emitting blue light and the second pixel PX2 is a green pixel, the second wavelength converting pattern WCP2 may include a second quantum dot (for example, a green quantum dot) that converts blue light emitted from the blue light emitting element into green light. The type of the second color converting particles and the color and/or wavelength of light converted in the second wavelength converting pattern WCP2 may be variously changed according to embodiments.

The light transmitting pattern LTP may be provided to efficiently emit light of a third color emitted from the light emitting element LD provided in the third light emitting area EMA3. For example, in case that the light emitting element LD provided in the third light emitting area EMA3 is a blue light emitting element emitting blue light and the third pixel PX3 is a blue pixel, the light transmitting pattern LTP may include at least one type of light scattering particles (for example, silica or other light scattering particles) for increasing the light efficiency of the pixel PX by scattering the blue light emitted from the blue light emitting element.

The light scattering particles do not have to be disposed only in the third light emitting area EMA3. For example, the light scattering particles may be selectively included in the first wavelength converting pattern WCP1 and/or the second wavelength converting pattern WCP2.

The light blocking pattern LBP may be disposed in the non-light emitting area NEA on the display element part DPL. In an embodiment, the light blocking pattern LBP may be formed in a mesh-like pattern that surrounds respective light emitting areas EMA and includes openings corresponding to the light emitting areas EMA, in a plan view. The light blocking pattern LBP may surround the wavelength converting patterns WCP and the light transmitting patterns LTP provided in respective light emitting areas EMA.

The light blocking pattern LBP may include at least one light blocking material that may block transmission of light and may absorb light. For example, the light blocking pattern LBP may include an organic material including at least one of graphite, carbon black, black pigment, and black dye, and at least one material of metals including chromium (Cr), or various other light blocking materials. The bank BNK and the light blocking pattern LBP may include a same light blocking material or different light blocking materials.

The second passivation layer PSS2 may be disposed on the wavelength converting patterns WCP and the light transmitting patterns LTP. In an embodiment, the second passivation layer PSS2 may include at least one insulating material and may be formed as a single layer or multilayer. For example, the second passivation layer PSS2 may include an organic insulating material and may substantially planarize the surface of the color converter CCL.

The color filter part CFL may be disposed on the color converter CCL. The color filter part CFL may include color filters CF provided in respective light emitting areas EMA. For example, the color filter part CFL may include a first color filter CF1 disposed in the first light emitting area EMA1 of the first pixel PX1, a second color filter CF2 disposed in the second light emitting area EMA2 of the second pixel PX2, and a third color filter CF3 disposed in the third light emitting area of EMA3 of the third pixel PX3. The color filter part CFL may include a planarization layer PLA that covers the color filters CF.

Each first color filter CF1 may be positioned on the light emitting element LD of each first pixel PX1 and may selectively transmit light of the first color. For example, the first color filter CF1 may include a color filter material of the first color that transmits light of the first color and blocks transmission of light of the second color and the third color.

Each second color filter CF2 may be positioned on the light emitting element LD of each second pixel PX2 and may selectively transmit light of the second color. For example, the second color filter CF2 may include a color filter material of the second color that transmits light of the second color and blocks transmission of light of the first color and the third color.

Each third color filter CF3 may be positioned on the light emitting element LD of each third pixel PX3 and may selectively transmit light of the third color. For example, the third color filter CF3 may include a color filter material of the third color that transmits light of the third color and blocks transmission of light of the first color and the second color.

The planarization layer PLA may be disposed on the color filters CF. In an embodiment, the planarization layer PLA may include an organic insulating material and may substantially planarize the surface of the color filter part CFL.

Figure 7:
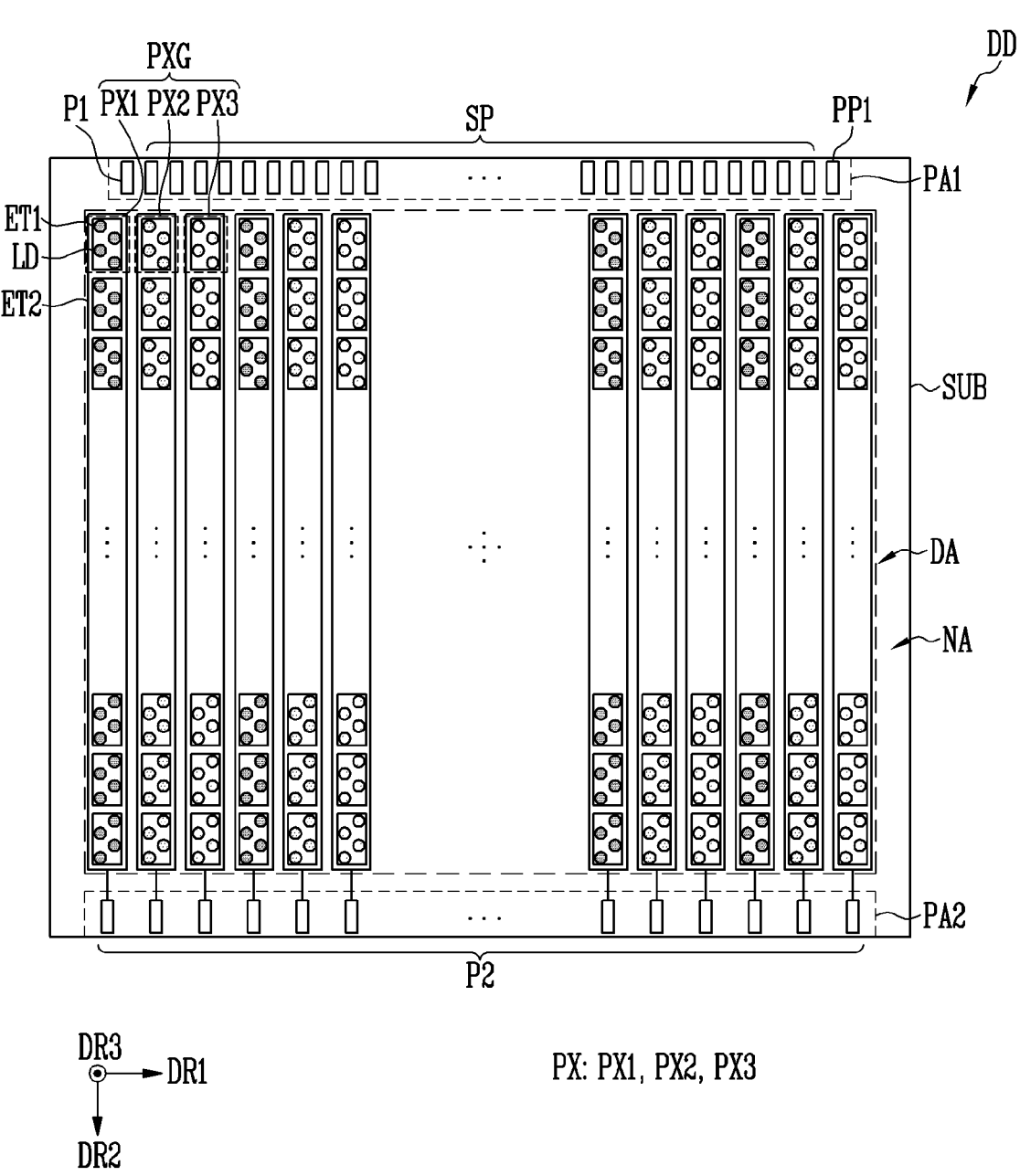
FIG. 7 illustrates a schematic plan view of a display device according to an embodiment of the disclosure.

FIG. 7 illustrates a schematic plan view of a display device DD according to an embodiment. For example, FIG. 7 illustrates a modified embodiment of the embodiment of FIG. 1.

Figure 8:
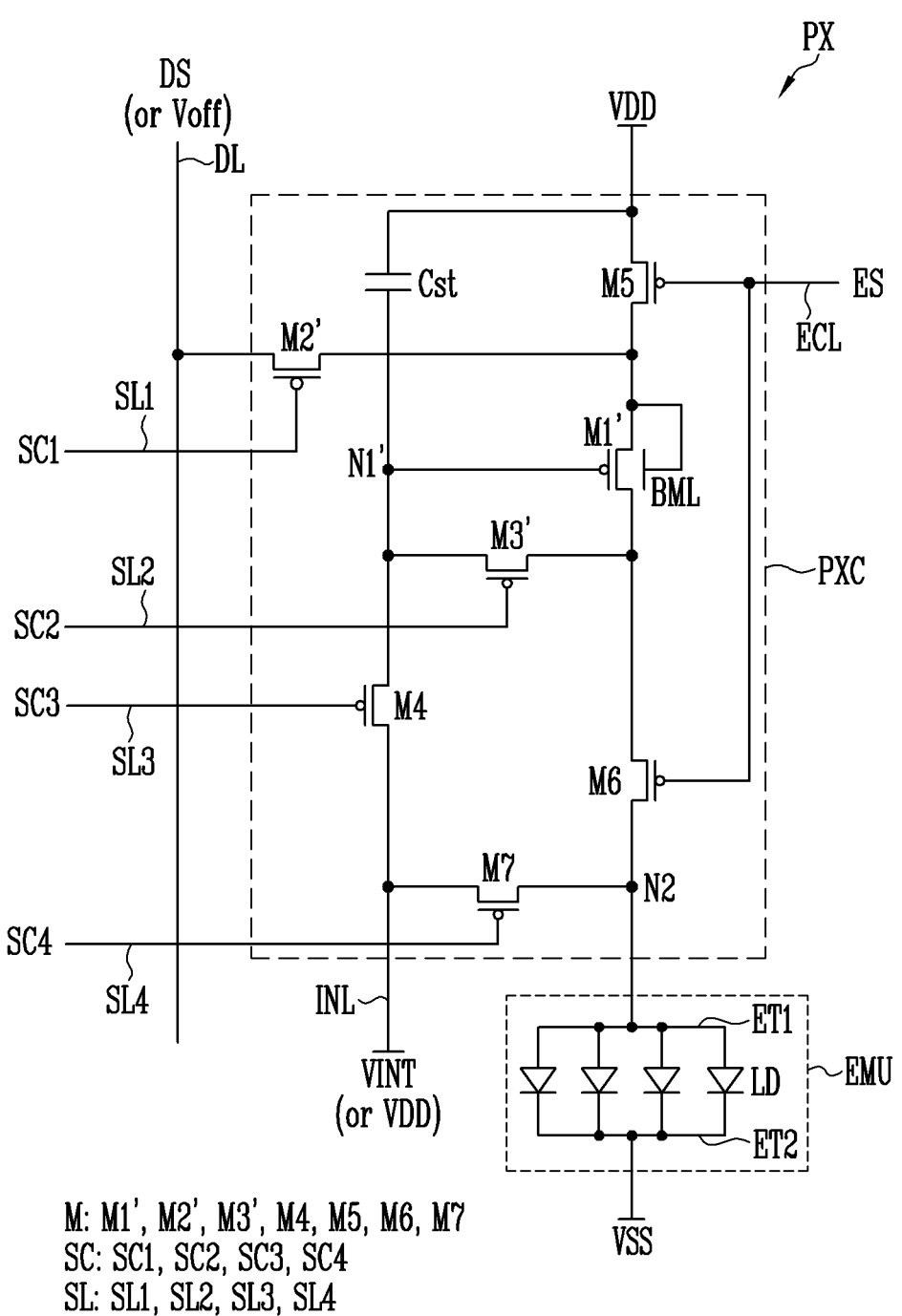
FIG. 8 illustrates a schematic diagram of an equivalent circuit of a pixel according to an embodiment of the disclosure.

FIG. 8 illustrates a schematic diagram of an equivalent circuit of a pixel PX according to an embodiment. For example, FIG. 8 illustrates an example of a pixel PX that may be disposed in the display area DA of FIG. 7, and illustrates a modified embodiment of the embodiment of FIG. 4.

FIGS. 7 and 8 illustrate a modified embodiment of the above-described embodiments (for example, the embodiment of FIGS. 1 and 4) in relation to the structure of the light emitting part EMU. In describing the embodiment of FIGS. 7 and 8, the same reference numerals are used to denote configurations similar to or identical to those of the above-described embodiments, and duplicate descriptions thereof will be omitted.

Referring to FIGS. 7 and 8, each pixel PX may include light emitting elements LD. FIGS. 7 and 8 illustrate an embodiment in which four light emitting elements LD are disposed in each pixel PX, but the number of light emitting elements LD provided in each pixel PX may be variously changed according to embodiments. The pixels PX may include the same number of light emitting elements LD or different numbers of light emitting elements LD.

In an embodiment, the light emitting elements LD provided in each pixel PX may be connected in parallel to each other between the first electrode ET1 and the second electrode ET2. For example, the light emitting elements LD may be connected in a forward direction between the first electrode ET1 and the second electrode ET2, and may be connected in parallel to each other. However, the disclosure is not limited thereto. For example, in an embodiment, the light emitting elements LD may be connected to each other only in series, or may be connected in a series/parallel mixed structure.

Figure 9:
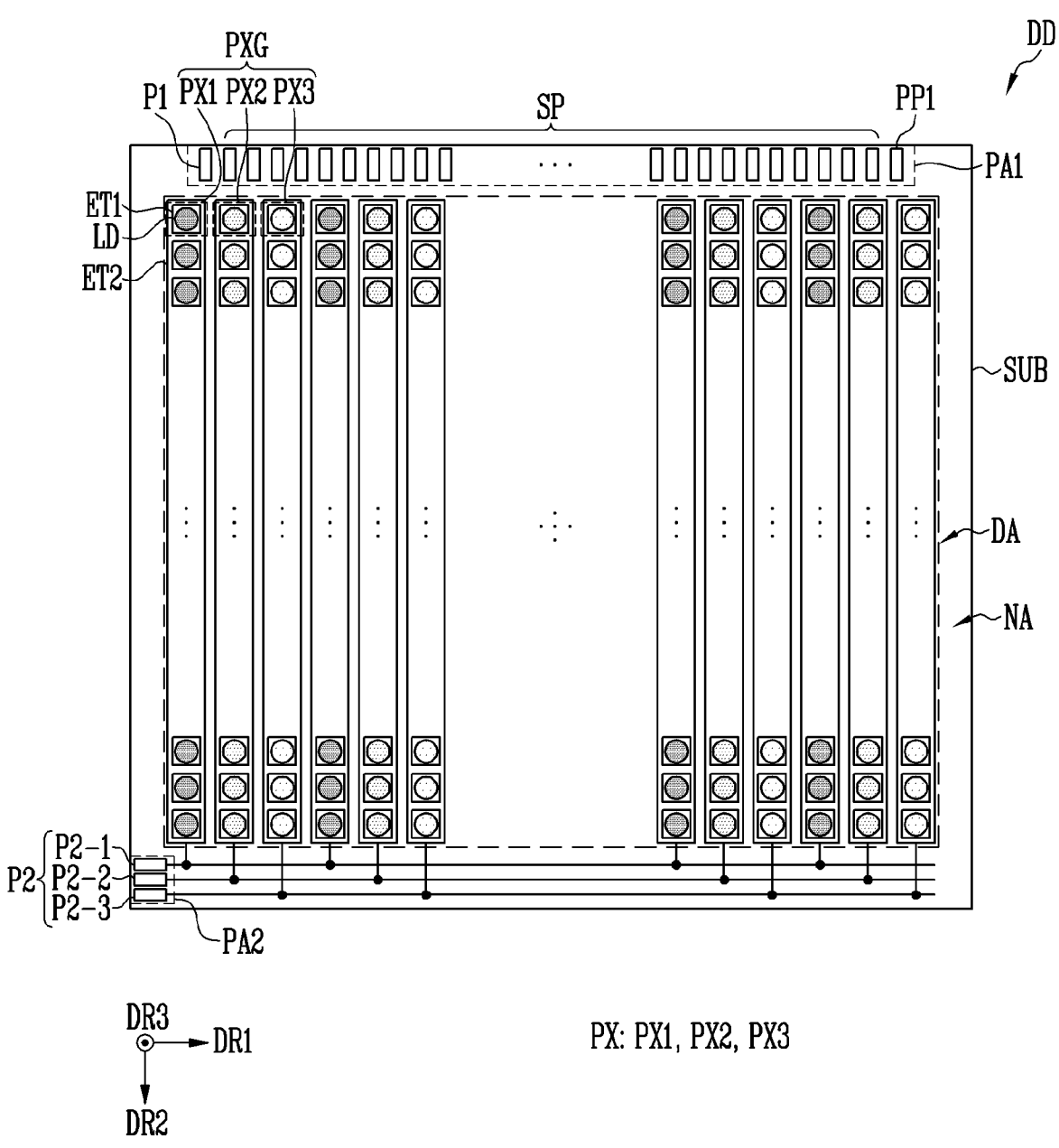
FIG. 9, FIG. 10A, and FIG. 10B each illustrate a schematic plan view of a display device according to an embodiment of the disclosure.
Figure 10A:
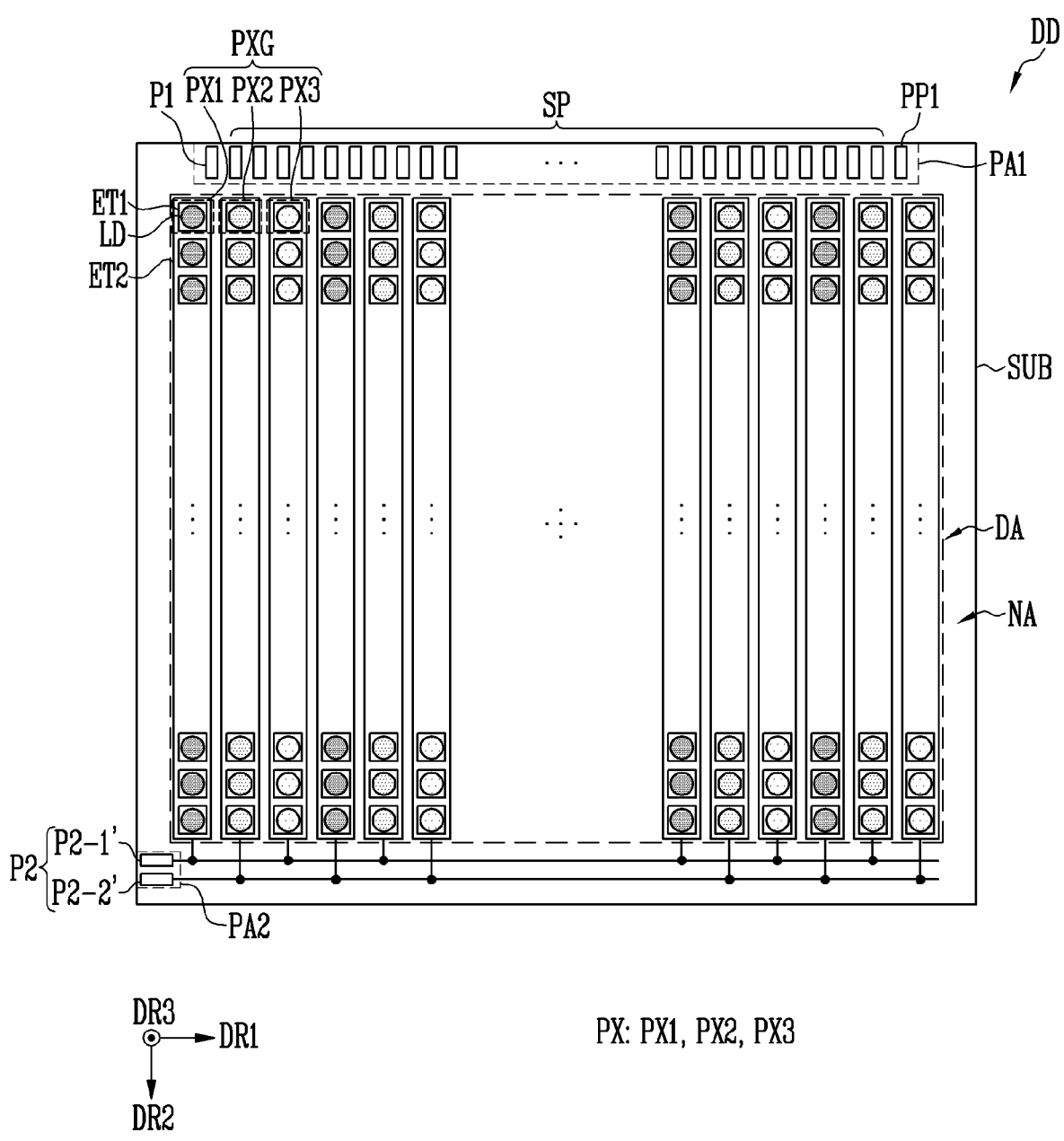
Figure 10B:
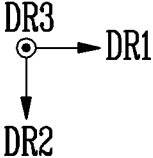

FIGS. 9, 10A, and 10B each illustrate a schematic plan view of a display device DD according to an embodiment. For example, FIGS. 9, 10A, and 10B illustrate different modified embodiments of the embodiment of FIG. 1 in relation to the configuration of the second pad part PA2, the connection structure of the second electrodes ET2 and the second pads P2, and the like. In describing the embodiment of FIGS. 9, 10A, and 10B, the same reference numerals are used to denote configurations similar to or identical to those of the above-described embodiments, and duplicate descriptions thereof will be omitted.

Referring to FIGS. 9, 10A, and 10B, the number of the second pads P2 provided in the second pad part PA2 may be less than the number of the second electrodes ET2 provided in the display area DA. The second pads P2 may be electrically connected to the second electrodes ET2 in a ratio of about 1:K (where K is a natural number greater than or equal to 2). For example, the second electrodes ET2 may be divided into at least two second electrode groups, and the second electrodes ET2 included in each second electrode group may be electrically connected to a second pad P2 in common.

In an embodiment, the second electrodes ET2 of at least two pixels PX successively disposed in the first direction DR1 may be electrically connected to different second pads P2. For example, in each pixel row, the second electrodes ET2 electrically connected to the light emitting elements LD of the first pixel PX1 and the second pixel PX2 sequentially disposed in the first direction DR1 (or the second pixel PX2 and the third pixel PX3 or the third pixel PX3 and the first pixel PX1 that are sequentially disposed with each other in the first direction DR1) may be electrically connected to different second pads P2.

In the embodiment of FIG. 9, the second electrodes ET2 may be divided into three groups, and the second pad part PA2 may include three second pads P2 electrically connected to the second electrodes ET2 of each group. For example, the second electrodes ET2 may include the second electrodes ET2 of a first group provided in the first pixels PX1 to be electrically connected to the light emitting elements LD of the first pixels PX1, the second electrodes ET2 of a second group provided in the second pixels PX2 to be electrically connected to the light emitting elements LD of the second pixels PX2, and the second electrodes ET2 of a third group provided in the third pixels PX3 to be electrically connected to the light emitting elements LD of the third pixels PX3. The second pad part PA2 may include a (2-1)-th pad P2-1 commonly and electrically connected to the second electrodes ET2 of the first group (for example, the second electrodes ET2 of the first pixels PX1), a (2-2)-th pad P2-2 commonly and electrically connected to the second electrodes ET2 of the second group (for example, the second electrodes ET2 of the second pixels PX2), and a (2-3)-th pad P2-3 commonly and electrically connected to the second electrodes ET2 of the third group (for example, the second electrodes ET2 of the third pixels PX3).

In the embodiment of FIG. 10A, the second electrodes ET2 may be divided into two groups, and the second pad part PA2 may include two second pads P2 electrically connected to the second electrodes ET2 of each group. For example, the second electrodes ET2 may include the second electrodes ET2 of the first group provided in the pixels PX of the first group to be electrically connected to the light emitting elements LD of the pixels PX of the first group arranged in an odd-numbered pixel column, and the second electrodes ET2 of the second group provided in the pixels PX of the second group to be electrically connected to the light emitting elements LD of the pixels PX of the second group arranged in an even-numbered pixel column. The second pad part PA2 may include a (2-1)-th pad P2-1' commonly and electrically connected to the second electrodes ET2 of the first group (for example, odd-numbered second electrodes ET2), and a (2-2)-th pad P2-2' commonly and electrically connected to the second electrodes ET2 of the second group (for example, even-numbered second electrodes ET2).

In the embodiment of FIG. 10B, the (2-1)-th pad P2-1' and the (2-2)-th pad P2-2' may be disposed in the first pad part PA1. For example, the second pad part PA2 of FIG. 10A may be integrated with the first pad part PA1 as in the embodiment of FIG. 10B. In a similar manner, the (2-1)-th pad P2-1, the (2-2)-th pad P2-2, and the (2-3)-th pad P2-3 of FIG. 9 may also be disposed in the first pad part PA1.

In case that the first pad part PA1 and the second pad part PA2 are integrated with each other, it is possible to simplify the bonding process for electrically connecting the display panel to at least one circuit board and to simplify the structure of the display device DD. The non-display area NA of the display device DD (for example, the non-display area NA below the display area DA) may be reduced.

In addition to the above-described embodiments, the second electrodes ET2 may be divided into groups in various ways. The second pad part PA2 may include second pads P2 corresponding to the second electrodes ET2 of each group. The number and/or position of the second pads P2 may be variously changed according to embodiments. For example, the second pads P2 may be disposed inside the second pad part PA2 configured and/or formed separately from the first pad part PA1, or may be disposed inside the first pad part PA1.

In an embodiment, a voltage of the second power source VSS of a same level may be applied to the second pads P2, or voltages of the second power source VSS of different levels may be applied to at least two second pads P2. For example, the voltage of the second power source VSS applied to the second pads P2 may be set according to the type and structure of the display device DD, the inspection method and/or purpose of the display device DD, and/or the driving method of the display device DD.

In an embodiment, before the light emitting element inspection process for the display device DD, an optical inspection for the display device DD may be performed. For example, a test image is displayed on the display device DD, and imaging data obtained by imaging the test image displayed in the display area DA by using an imaging device is analyzed to detect defects in the pixels PX.

In an embodiment, the display device DD may include the pixels PX that are disposed and/or formed with high resolution compared with the imaging device, and the position at which the defect occurs may be roughly identified through the optical inspection. Thereafter, the light emitting element inspection process may be performed, and the position at which the defect occurred may be specified in detail by synthesizing the light emitting element inspection result and the optical inspection result. For example, by comparing the light emitting element inspection result and the optical inspection result, it is possible to precisely determine the position at which the defect occurred. For example, the defective pixel PX may be detected by performing a logical multiplication operation on the defective position data detected in the light emitting element inspection and the defective position data detected in the optical inspection result.

According to the above-described embodiments, it is possible to easily detect defects in the pixels PX even in the display device DD of high resolution. By reducing the number of the second pads P2, it is possible to reduce the second pad part PA2 and to reduce the non-display area NA of the display device DD.

Figure 11:
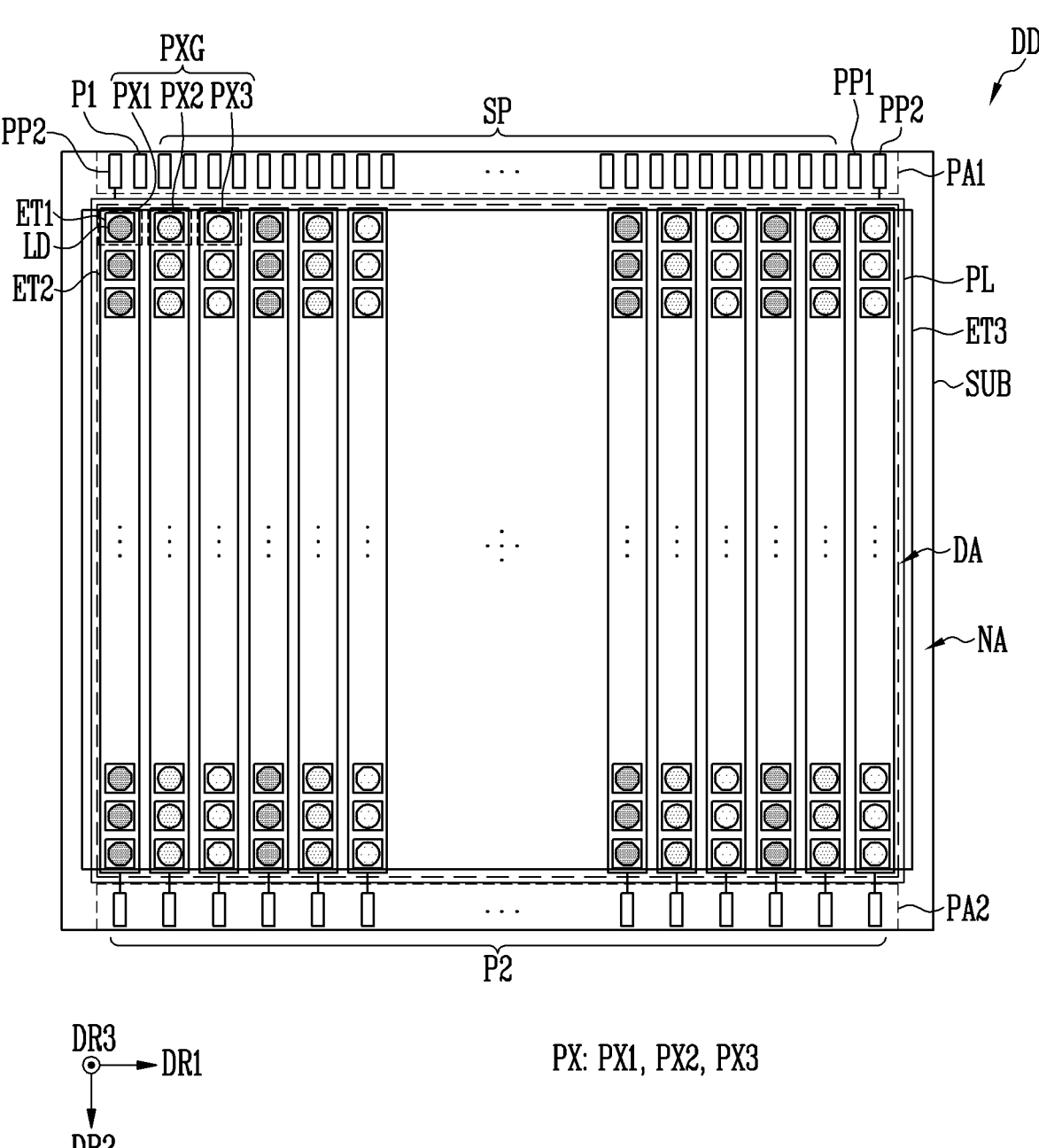
FIG. 11 illustrates a schematic plan view of a display device according to an embodiment of the disclosure.
Figure 12:
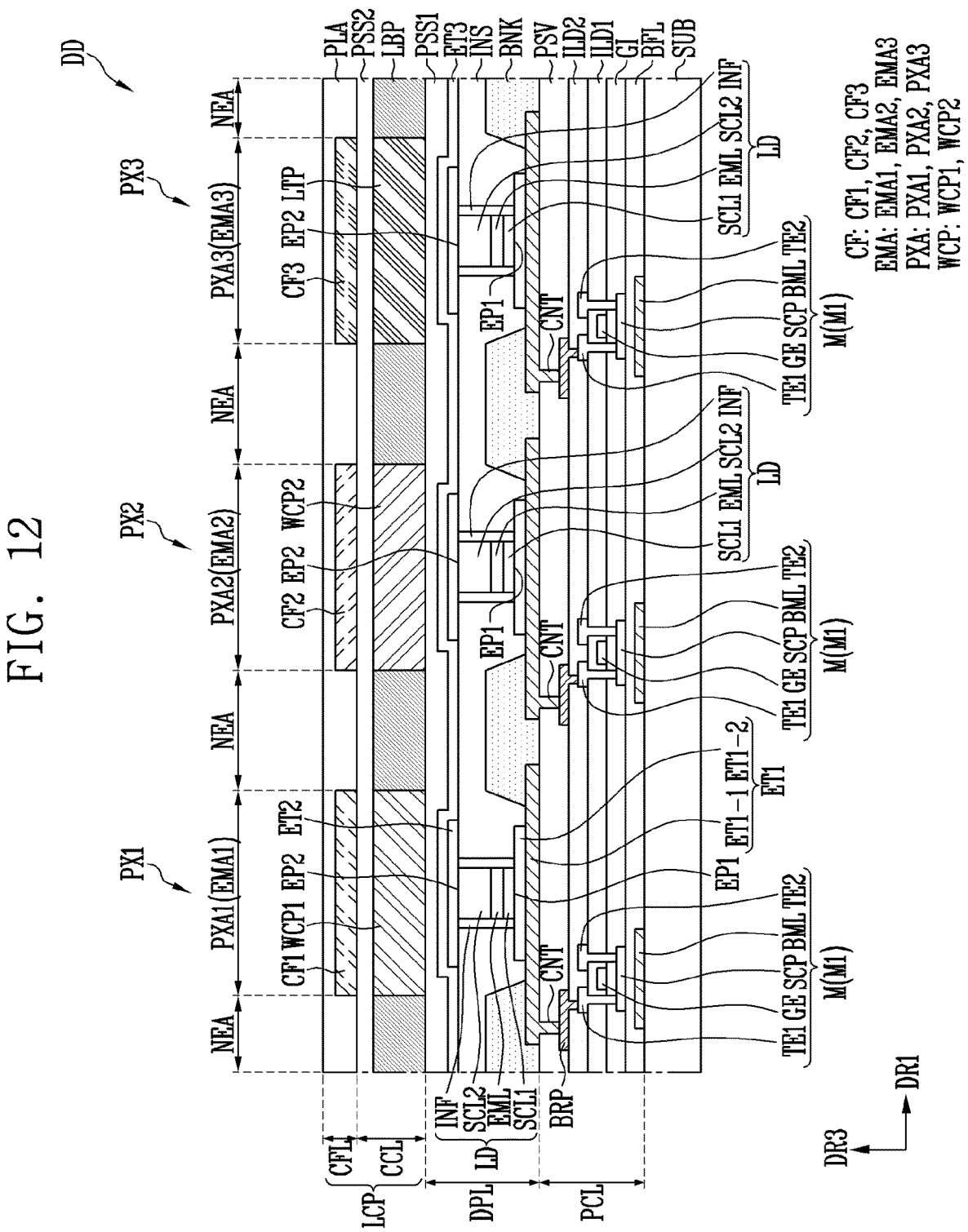
FIG. 12 illustrates a schematic cross-sectional view of a display device according to an embodiment of the disclosure.

FIG. 11 illustrates a schematic plan view of a display device DD according to an embodiment. For example, FIG. 11 illustrates a modified embodiment of the embodiment of FIG. 1 in relation to the second electrodes ET2, and illustrates an embodiment including an additional configuration electrically connected to the second electrodes ET2. FIG. 12 illustrates a schematic cross-sectional view of a display device DD according to an embodiment. For example, FIG. 12 illustrates a schematic cross-sectional view of a portion of the display device DD according to the embodiment of FIG. 11, and as an example, illustrates a schematic cross-sectional view of the display device DD in a portion of the display area DA in which a pixel group PXG is disposed. In describing the embodiment of FIGS. 11 and 12, the same reference numerals are used to denote configurations similar to or identical to those of the above-described embodiments, and duplicate descriptions thereof will be omitted.

Referring to FIGS. 11 and 12, the display device DD may further include a third electrode ET3 disposed on the second electrodes ET2. The display device DD may further include a power line PL electrically connected to the third electrode ET3 and at least one second power pad PP2.

The third electrode ET3 may be entirely disposed on the second electrodes ET2 and may be electrically connected to the second electrodes ET2. The third electrode ET3 may be formed after the light emitting element inspection is completed. For example, defects in the light emitting elements LD provided in respective pixels PX may be individually detected by performing the light emitting element inspection in a state in which the second electrodes ET2 are electrically separated from each other. After the light emitting element inspection process and/or a defect repairing process are completed, the third electrode ET3 may be formed on the second electrodes ET2. Accordingly, the second electrodes ET2 may be electrically connected to each other.

In an embodiment, the third electrode ET3 may be disposed directly on the second electrodes ET2 to contact the second electrodes ET2 to be electrically connected to the second electrodes ET2. In an embodiment, the third electrode ET3 may be disposed to overlap the second electrodes ET2 with at least one insulating layer interposed therebetween to be electrically connected to the second electrodes ET2 by at least one contact hole or via hole.

The third electrode ET3 may have conductivity by including at least one conductive material. In an embodiment, the third electrode ET3 may include a transparent conductive material. For example, the third electrode ET3 may include at least one material of a conductive oxide such as an indium tin oxide (ITO), an indium zinc oxide (IZO), a zinc oxide (ZnO or ZnO$_2$), an indium gallium zinc oxide (IGZO), or an indium tin zinc oxide (ITZO) and a conductive polymer such as poly(3,4-ethylenedioxythiophene) (PEDOT), or other transparent conductive material. The third electrode ET3 may be substantially transparent. Accordingly, light output efficiency (for example, a front light output rate) of light generated by each light emitting element LD may be increased. The third electrode ET3 may be configured of a single layer or multilayer. The second electrode ET2 and the third electrode ET3 may include a same transparent conductive material, or may include different transparent conductive materials.

In an embodiment, the third electrode ET3 may be a plate-shaped electrode disposed entirely in the display area DA, and may be uniformly formed in the display area DA. The third electrode ET3 may prevent or alleviate a spot from being viewed in the display area DA due to a deviation in optical characteristics for each area due to division of the second electrodes ET2, and may allow the display area DA to be entirely uniformly viewed.

In an embodiment, the third electrode ET3 may be extended to the non-display area NA around the display area DA to overlap the power line PL. The third electrode ET3 may be electrically connected to the power line PL in an area overlapping the power line PL.

The power line PL may be disposed around the display area DA to overlap the third electrode ET3. For example, the power line PL may be disposed in the non-display area NA to have a shape surrounding the display area DA in a plan view, and may overlap a portion of the third electrode ET3. In an embodiment, the power line PL and routing wires electrically connected between the signal pads SP and the display area DA may be disposed on different layers. In this case, the power line PL may cross the routing wires (for example, fan-in or fan-out wires) while completely surrounding the display area DA in a plan view. However, the position, shape, and/or size of the power line PL may be changed according to embodiments. For example, in another embodiment, the power line PL may only partially surround the circumference or perimeter of the display area DA and may not cross the routing wires.

In an embodiment, the third electrode ET3 may be provided in the display element part DPL, and the power line PL may be provided in the non-display area NA of the pixel circuit part PCL. The third electrode ET3 may be electrically connected to the power line PL through at least one contact hole or via hole in an area overlapping the power line PL.

The second power pad PP2 may be disposed and/or provided in the first pad part PA1 and may be electrically connected to the power line PL. In an embodiment, second power pads PP2 may be disposed in the first pad part PA1. For example, a second power pad PP2 may be respectively disposed in both edge areas of the first pad part PA1. The number and/or position of the second power pads PP2 may be changed according to embodiments.

The voltage of the second power source VSS may be applied to the second power pad PP2 during the driving period of the display device DD. The voltage of the second power source VSS may be supplied to the second electrodes ET2 through the power line PL and the third electrode ET3.

The voltage of the second power source VSS may be supplied to the second electrodes ET2 through the second pads P2 during the light emitting element inspection process performed before the process of forming the third electrode ET3. While the light emitting element inspection process is in progress, as the pixels PX are sequentially driven in units of pixel rows, currents may be individually detected in the second pads P2 corresponding to the second electrodes ET2 provided in each pixel column. Accordingly, defects caused by the light emitting elements LD electrically connected to respective second electrodes ET2 may be individually detected.

Figure 13:
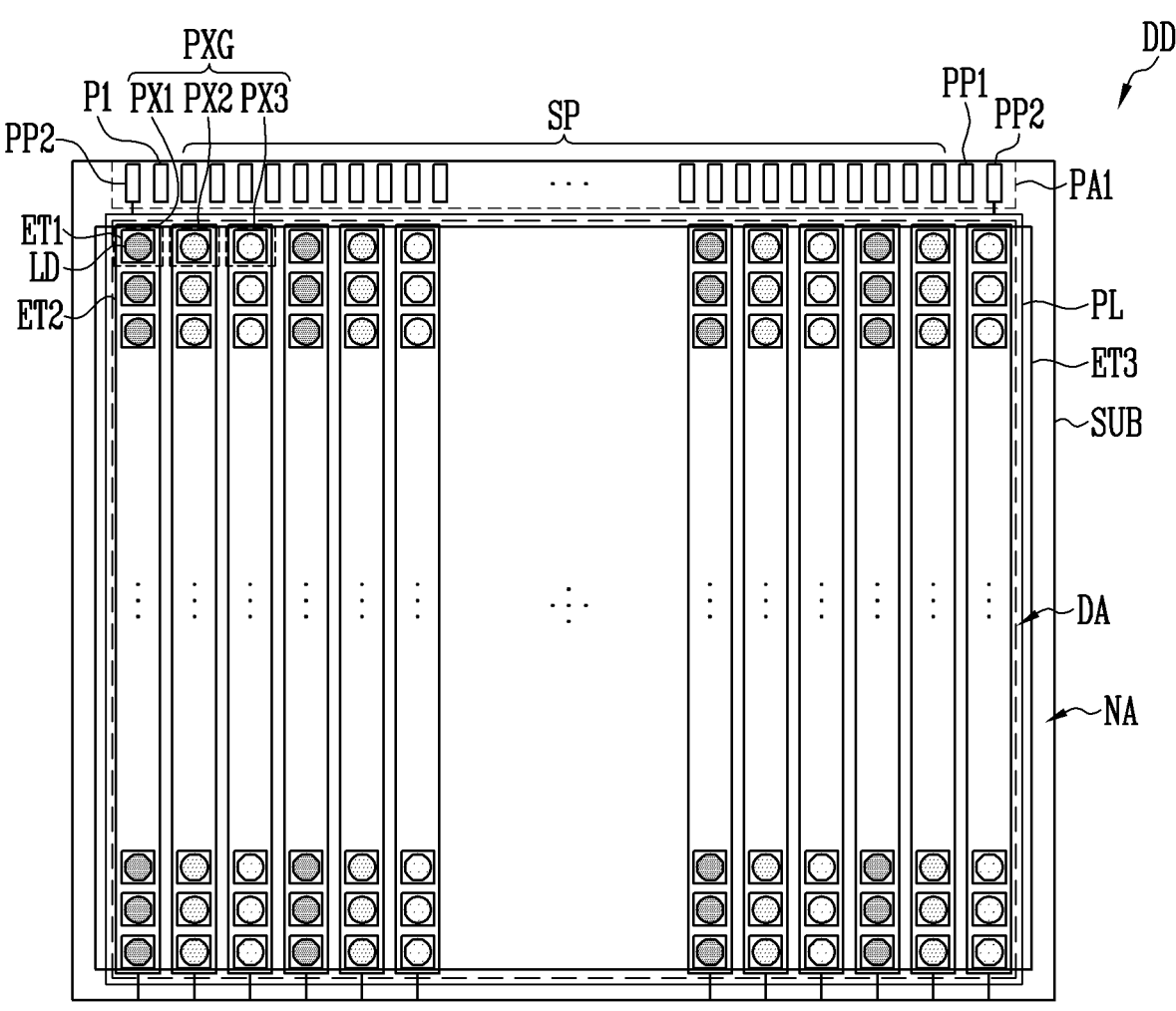
FIG. 13 illustrates a schematic plan view of a display device according to an embodiment of the disclosure.
Figure 13:
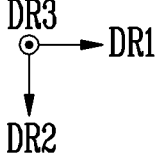

FIG. 13 illustrates a schematic plan view of a display device DD according to an embodiment. For example, FIG. 13 illustrates a modified embodiment of the embodiment of FIG. 11 in relation to the second pad part PA2. In describing the embodiment of FIG. 13, the same reference numerals are used to denote configurations similar to or identical to those of the above-described embodiments (for example, the embodiment of FIGS. 11 and 12), and duplicate descriptions thereof will be omitted.

Referring to FIGS. 11 to 13, the display device DD may not include the second pad part PA2. For example, during the manufacturing process of the display device DD, the second pads P2 electrically connected to the second electrodes ET2 may be formed, and the light emitting element inspection process may be performed using the second pads P2. After the light emitting element inspection process is completed, the second pad part PA2 may be removed from the display device DD by a cutting process and/or etching process.

The voltage of the second power source VSS may be applied to the second power pad PP2 during the driving period of the display device DD. The voltage of the second power source VSS may be supplied to the second electrodes ET2 through the power line PL and the third electrode ET3.

The display device DD from which the second pad part PA2 is removed may include the remaining components excluding the second pad part PA2 in the display device DD according to the embodiment of FIG. 11. For example, the display device DD according to the embodiment of FIG. 13 may include the first electrodes ET1 arranged in the display area DA in the first direction DR1 and the second direction DR2 and separated from each other, and the pixels PX including respective light emitting elements LD electrically connected to respective first electrodes ET1. The display device DD may include the second electrodes ET2 arranged in the first direction DR1 and electrically connected to the light emitting elements LD of the pixels PX respectively arranged in the second direction DR2, the third electrode ET3 disposed entirely on the second electrodes ET2 and electrically connected to the second electrodes ET2, and the first pad part PA1 including at least one first pad P1, at least one first power pad PP1, and at least one second power pad PP2.

As in the embodiment of FIG. 13, the display device DD from which the second pad part PA2 is removed may have a reduced non-display area NA, compared with the display device DD including the second pad part PA2 as in the embodiment of FIG. 11. For example, as in the embodiments of FIGS. 11 and 13, the display device DD including the second power pad PP2, the power line PL, and the third electrode ET3 may include the second pad part PA2, or may not include the second pad part PA2.

In addition to the configuration (for example, the third electrode ET3) added in the embodiments of FIGS. 11 to 13, the display device DD including another component for applying the voltage of the second power source VSS to the second electrodes ET2 without passing through the second pads P2 may include the second pad part PA2 or may not include the second pad part PA2. For example, in the display device DD including a conductive pattern (for example, a shorting bar), a wire, and/or a pad capable of electrically connecting the second electrodes ET2 to the first pad part PA1 instead of the third electrode ET3 and the like, the second pad part PA2 may be removed after the light emitting element inspection process is completed.

FIGS. 11 and 13 illustrate the modified embodiments of the embodiment illustrated in FIG. 1, but embodiments of the disclosure are not limited thereto. For example, even the display device DD according to at least one of the embodiments illustrated in FIGS. 2, 7, 9, 10A, and 10B, may further have the third electrode ET3, the power line PL, and the at least one second power pad PP2.

The manufacturing process of the display device DD for manufacturing the display device DD according to at least one of the embodiments of FIGS. 1 to 13 may include the light emitting element inspection process using the second electrodes ET2 and the second pads P2.

For example, the manufacturing process (or manufacturing method) of the display device DD according to the embodiments of FIGS. 1 to 13 may include applying the voltage of the first power source VDD to the first electrodes ET1 arranged in the first direction DR1 and the second direction DR2 in the display area DA through the first pad P1, applying the voltage of the second power source VSS to the second electrodes ET2 through the second pads P2, and detecting the current flowing through each of the second pads P2. In an embodiment, through respective second pads P2 electrically connected to the second electrodes ET2 provided in respective pixel columns while sequentially driving the pixels PX in units of pixel rows in the second direction DR2, the currents flowing through respective second electrodes ET2 may be individually detected. Accordingly, it is possible to precisely detect defects caused by respective light emitting elements LD provided in respective pixels PX and a position of the pixel PX in which the defects occur.

In an embodiment, in case that a defect caused by at least one light emitting element LD provided in at least one pixel PX is detected, a process of repairing the defect may be performed. Accordingly, the defects in the display device DD may be prevented or reduced, and the manufacturing efficiency of the display device DD may be improved.

In an embodiment, in case that the display device DD including the third electrode ET3 as in the embodiments of FIGS. 11 to 13 is manufactured, the process of forming the third electrode ET3 on the second electrodes ET2 after the light emitting element inspection process is completed, may proceed. For example, after the light emitting element inspection process is completed, it is possible to entirely form the third electrode ET3 on the second electrodes ET2.

FIGS. 14 to 17 each illustrate a schematic perspective view of an electronic device according to an embodiment. For example, FIGS. 14 to 17 illustrate different embodiments of an electronic device to which the display device DD according to the above-described embodiments may be applied.

Figures 14, 15:
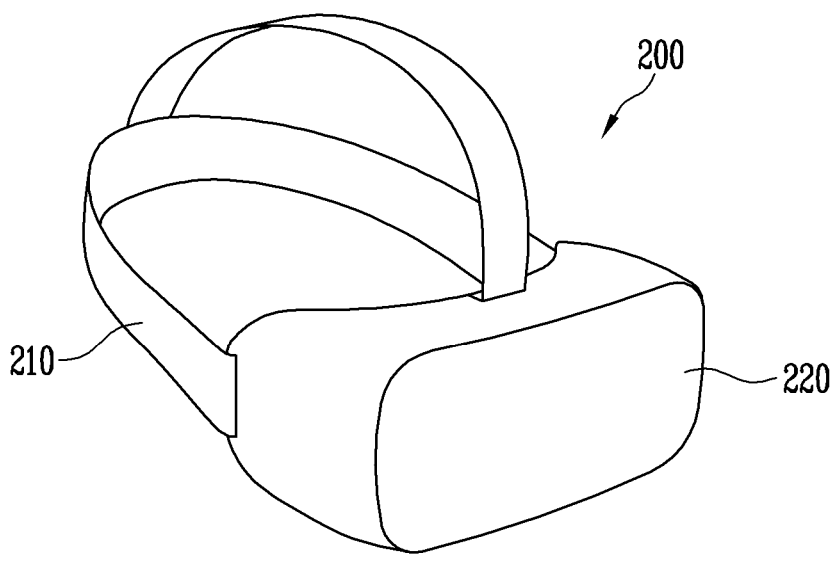
FIG. 14 to FIG. 17 each illustrate a schematic perspective view of an electronic device according to an embodiment of the disclosure.

Referring to FIG. 14, the display device DD may be applied to a smart glass 100 including a frame 110 and a lens part 120. The smart glass 100 is a wearable electronic device that may be worn on a user's face, and may have a structure in which a portion of the frame 110 is folded or unfolded. For example, the smart glass 100 may be a wearable device for augmented reality (AR).

The frame 110 may include a housing 110a supporting the lens part 120 and a leg part 110b for a user to wear. The leg part 110b may be coupled (or connected) to the housing 110a by a hinge to be folded or unfolded.

A battery, a touch pad, a microphone, and a camera may be embedded in the frame 110. A projector that outputs light and a processor that controls an optical signal may be embedded in the frame 110.

The lens part 120 may be an optical member that transmits light or reflects light. The lens part 120 may include glass, a transparent synthetic resin, or the like.

The lens part 120 may reflect an image by an optical signal transmitted from the projector of the frame 110, by a rear surface (for example, a surface in a direction directed to the user's eyes) of the lens part 120, so that it is possible for the user's eyes to recognize it. For example, the user may recognize information such as time and date displayed on the lens part 120. For example, the lens part 120 is a kind of display device, and the display device DD according to an embodiment may be applied to the lens part 120.

Referring to FIG. 15, the display device DD may be applied to a head mounted display (HMD) 200 including a head mounting band 210 and a display receiving case 220. The head mounted display 200 may be a wearable electronic device that may be worn on the user's head.

The head mounting band 210 may be connected to the display receiving case 220 to fix the display receiving case 220. In the drawing, the head mounting band 210 has been shown to surround an upper surface the user's head and both side surfaces thereof, but the disclosure is not limited thereto. The head mounting band 210 fixes the head mounted display 200 to the user's head and may be formed in a form of a spectacle frame, a helmet, or the like.

The display receiving case 220 may accommodate the display device DD and may include at least one lens. The at least one lens may be a part that provides an image to the user. For example, the display device DD according to the embodiment may be applied to a left eye lens and a right eye lens implemented in the display receiving case 220.

Figure 16:
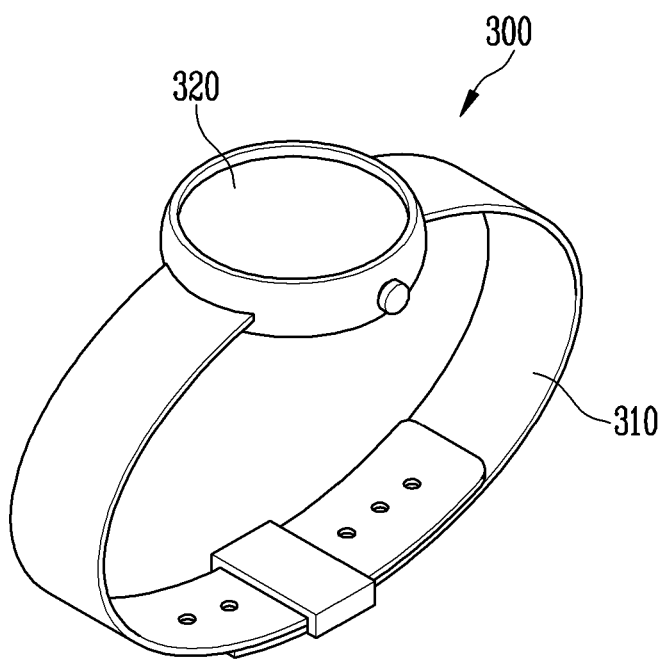

Referring to FIG. 16, the display device DD may be applied to a smart watch 300 including a strap part 310 and a display part 320.

The smart watch 300 is a wearable electronic device and may have a structure in which the strap part 310 is mounted on a user's wrist. The display device DD according to an embodiment is applied to the display part 320, so that image data including time information may be provided to the user.

Figure 17:
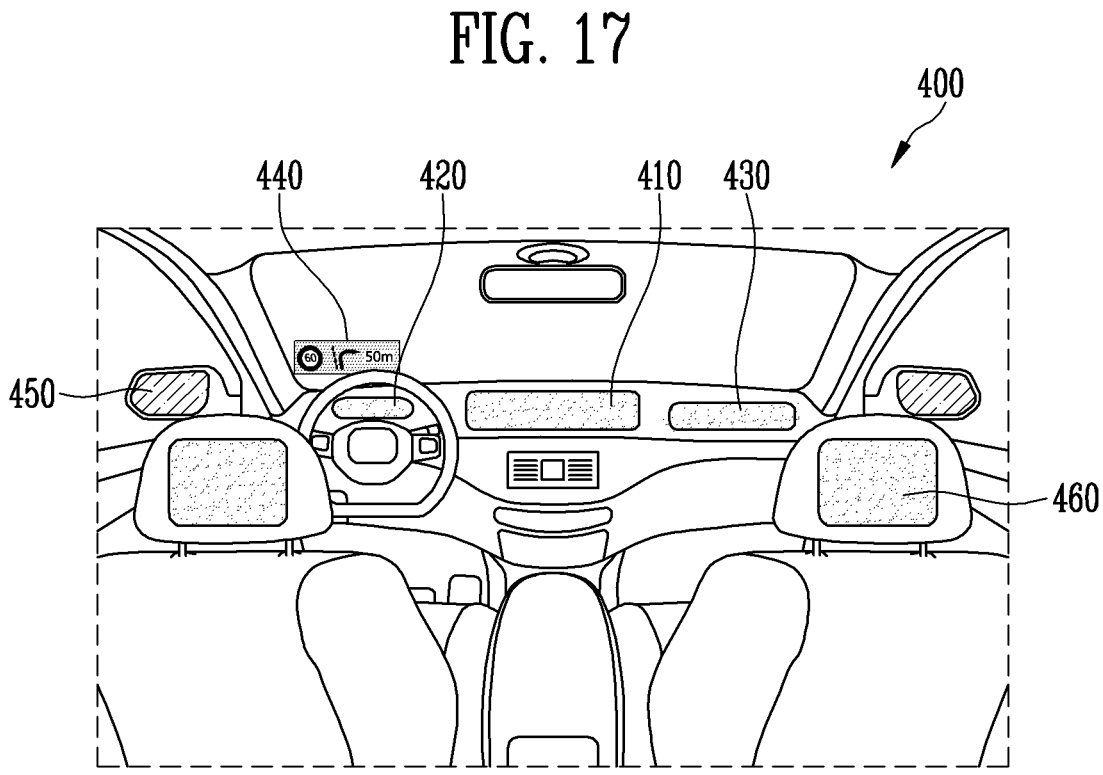

Referring to FIG. 17, the display device DD may be applied to an automotive display 400. The automotive display 400 may mean an electronic device that is provided inside and/or outside a vehicle to provide image data.

In an embodiment, the display device DD may be applied to at least one of an infotainment panel 410, a cluster 420, a co-driver display 430, a head-up display 440, a side-view mirror display 450, and a rear seat display 460, which are provided in the vehicle.

The technical idea of the disclosure has been specifically described according to the embodiments, but it should be noted that the foregoing embodiments are provided only for illustration while not limiting the disclosure. In addition, it will be understood by those skilled in the art that various changes in form and details may be made therein without departing from the scope of the disclosure.

The technical scope of the disclosure may be determined by on the technical scope of the accompanying claims. In addition, all changes or modifications that come within the meaning and range of the claims and their equivalents will be interpreted as including the range of the disclosure.

What is claimed is:

1. A display device comprising:
pixels that are arranged in a display area in a first direction and a second direction and that include
first electrodes separated from each other; and
light emitting elements electrically connected to the first electrodes;
second electrodes that are arranged separately from each other in the first direction and that are each electrically connected to the light emitting elements of the pixels arranged in the second direction;
a first pad part including a first pad electrically connected to the first electrodes; and
a second pad part including second pads, each of the second pads being respectively electrically connected to a different one of the second electrodes among the second electrodes.

2. The display device of claim 1, wherein the first pad part and the second pad part face each other with the display area disposed between the first pad part and the second pad part.

3. The display device of claim 1, wherein the pixels further include pixel circuits electrically connected to the first electrodes, respectively.

4. The display device of claim 3, wherein
the first pad is an initialization power pad to which a voltage of an initialization power source is applied, and
the first pad part further includes:
signal pads electrically connected to the pixel circuits of the pixels and to which driving signals of each of the pixel circuits are applied; and
a first power pad electrically connected to the pixel circuits of the pixels and to which a voltage of a first power source is applied.

5. The display device of claim 4, wherein the pixel circuits include:
driving transistors electrically connected between the first power pad and the first electrodes; and
initialization transistors electrically connected between the first pad and the first electrodes.

6. The display device of claim 5, wherein
the light emitting elements of the pixels sequentially arranged in the second direction are commonly electrically connected to one of the second electrodes, and
the initialization transistors of the pixels sequentially arranged in the second direction are electrically connected to different gate lines to be sequentially turned on.

7. The display device of claim 1, wherein the light emitting elements are disposed directly on the first electrodes, and each of the second electrodes is disposed directly on the light emitting elements of the pixels sequentially arranged in the second direction.

8. The display device of claim 7, wherein each of the light emitting elements includes:

a first end portion electrically contacting a corresponding one of the first electrodes and including a first semiconductor layer;

a second end portion electrically contacting a corresponding one of the second electrodes and including a second semiconductor layer; and a light emitting layer disposed between the first semiconductor layer and the second semiconductor layer.

9. The display device of claim 1, wherein the second pads are electrically connected to the second electrodes at a ratio of 1:1.

10. A manufacturing method of a display device, comprising:

applying a voltage of a first power source to first electrodes of the display device through a first pad of the display device;

applying a voltage of a second power source to second electrodes of the display device through second pads of the display device; and detecting a current flowing in each of the second pads, wherein while sequentially applying the voltage of the first power source to the first electrodes arranged in a second direction, a current flowing in each of the second electrodes is individually detected through the second pads, so that defects caused by light emitting elements of the display device are detected, the first electrodes are arranged in a first direction and the second direction, the second electrodes are arranged in the first direction and disposed on the light emitting elements arranged in the second direction, the first pad is electrically connected to the first electrode, and the second pads are electrically connected to the second electrodes.

11. The manufacturing method of the display device of claim 10, further comprising:

in case that a defect caused by at least one of the light emitting elements is detected, repairing the defect.

12. The manufacturing method of the display device of claim 10, further comprising:

forming a third electrode entirely on the second electrodes.

13. An electronic device, comprising:

a processor to provide input image data; and a display device to display an image based on the input image data, wherein the display device comprises:

pixels that are arranged in a display area in a first direction and a second direction and that include:

first electrodes separated from each other; and light emitting elements electrically connected to the first electrodes;

second electrodes that are arranged separately from each other in the first direction and that are each electrically connected to the light emitting elements of the pixels arranged in the second direction;

a first pad part including a first pad electrically connected to the first electrodes; and a second pad part including second pads, each of the second pads being respectively electrically connected to a different one of the second electrodes among the second electrodes.

14. The electronic device of claim 13, wherein the first pad part and the second pad part face each other with the display area disposed between the first pad part and the second pad part.

15. The electronic device of claim 13, wherein the pixels further include pixel circuits electrically connected to the first electrodes, respectively.

16. The electronic device of claim 15, wherein the first pad is an initialization power pad to which a voltage of an initialization power source is applied, and the first pad part further includes:

signal pads electrically connected to the pixel circuits of the pixels and to which driving signals of each of the pixel circuits are applied; and a first power pad electrically connected to the pixel circuits of the pixels and to which a voltage of a first power source is applied.

17. The electronic device of claim 16, wherein the pixel circuits include:

driving transistors electrically connected between the first power pad and the first electrodes; and initialization transistors electrically connected between the first pad and the first electrodes.

18. The electronic device of claim 17, wherein the light emitting elements of the pixels sequentially arranged in the second direction are commonly electrically connected to one of the second electrodes, and the initialization transistors of the pixels sequentially arranged in the second direction are electrically connected to different gate lines to be sequentially turned on.

19. The electronic device of claim 13, wherein the light emitting elements are disposed directly on the first electrodes, and each of the second electrodes is disposed directly on the light emitting elements of the pixels sequentially arranged in the second direction.

20. The electronic device of claim 19, wherein each of the light emitting elements includes:

a first end portion electrically contacting a corresponding one of the first electrodes and including a first semiconductor layer;

a second end portion electrically contacting a corresponding one of the second electrodes and including a second semiconductor layer; and a light emitting layer disposed between the first semiconductor layer and the second semiconductor layer.

21. The electronic device of claim 13, wherein the second pads are electrically connected to the second electrodes at a ratio of 1:1.

* * * * *